(12) United States Patent
Kuga

(10) Patent No.: US 12,105,119 B2
(45) Date of Patent: Oct. 1, 2024

(54) ELECTRICAL CONTACTOR AND ELECTRICAL CONNECTING APPARATUS

(71) Applicant: KABUSHI KAISHA NIHON MICRONICS, Tokyo (JP)

(72) Inventor: Tomoaki Kuga, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 428 days.

(21) Appl. No.: 17/440,401

(22) PCT Filed: Sep. 6, 2019

(86) PCT No.: PCT/JP2019/035175
§ 371 (c)(1),
(2) Date: Sep. 17, 2021

(87) PCT Pub. No.: WO2020/217561
PCT Pub. Date: Oct. 29, 2020

(65) Prior Publication Data
US 2022/0155347 A1    May 19, 2022

(30) Foreign Application Priority Data

Apr. 26, 2019  (JP) .................................. 2019-085504

(51) Int. Cl.
*G01R 1/073*    (2006.01)
*H01R 12/55*    (2011.01)
(Continued)

(52) U.S. Cl.
CPC ......... *G01R 1/07357* (2013.01); *H01R 12/55* (2013.01); *H01R 13/15* (2013.01); *H01R 13/2407* (2013.01)

(58) Field of Classification Search
CPC ............ G01R 1/07357; G01R 1/06738; G01R 1/06716; G01R 1/073; H01R 13/2407; H01R 12/55; H01R 12/52
See application file for complete search history.

(56) References Cited

U.S. PATENT DOCUMENTS

| | | | |
|---|---|---|---|
| 4,015,337 A | | 4/1977 | Taylor |
| 4,961,709 A | * | 10/1990 | Noschese ........... H01R 13/2421 439/82 |

(Continued)

FOREIGN PATENT DOCUMENTS

| | | |
|---|---|---|
| CN | 100550331 C | 4/2005 |
| CN | 106574937 A | 4/2017 |

(Continued)

OTHER PUBLICATIONS

International Search Report cited in International Appln. PCT/JP2019/035175 dated Oct. 25, 2019.

(Continued)

*Primary Examiner* — Briggitte R. Hammond
(74) *Attorney, Agent, or Firm* — BACON & THOMAS, PLLC

(57) ABSTRACT

In order to improve conductivity, the number of components is decreased, and a sliding property of an elastic member can be improved. Elastic force can be controlled in accordance with a characteristic of a contact object, and electrical contact stability with the contact object can be improved. An electrical contactor of the present disclosure is formed by winding a plate member having conductivity. The electrical contactor includes a first contact part that is formed by winding a first tip part of the plate member, a first elastic part that is formed by winding an upper arm part having a tapered shape, a second contact part that is formed by winding a second tip part, a second elastic part that is formed by (Continued)

winding a lower arm part having a tapered shape, and a cylindrical part that is formed by winding a main body part that is a plate member.

17 Claims, 14 Drawing Sheets

(51) Int. Cl.
  *H01R 13/15* (2006.01)
  *H01R 13/24* (2006.01)

(56) References Cited

U.S. PATENT DOCUMENTS

| | | | | |
|---|---|---|---|---|
| 6,843,658 | B2* | 1/2005 | Kuwabara | H01R 13/2421 |
| | | | | 439/66 |
| 6,967,492 | B2* | 11/2005 | Tsui | G01R 1/06733 |
| | | | | 324/755.05 |
| 9,435,827 | B2* | 9/2016 | Pak | G01R 3/00 |
| 11,482,805 | B2* | 10/2022 | Kuga | G01R 1/06722 |
| 2017/0229802 | A1 | 8/2017 | Kazama et al. | |
| 2018/0348256 | A1* | 12/2018 | Hwang | G01R 1/06727 |
| 2019/0036262 | A1 | 1/2019 | Ogasawara et al. | |
| 2019/0178910 | A1 | 6/2019 | Ota | |

FOREIGN PATENT DOCUMENTS

| | | |
|---|---|---|
| CN | 108283014 A | 7/2018 |
| CN | 108603897 A | 9/2018 |
| CN | 109406835 A | 3/2019 |
| JP | 2006180601 A | 7/2006 |
| JP | 2008282746 A | 11/2008 |
| JP | 2009276120 A | 11/2009 |
| JP | 2011-12992 A | 1/2011 |
| JP | 2014235779 A | 12/2014 |
| JP | 2017-147099 A | 8/2017 |
| JP | 2019009102 A | 1/2019 |
| JP | 2019030120 A | 2/2019 |
| KR | 10-2012-0031493 A | 4/2012 |
| KR | 10-20120137592 A | 12/2012 |
| KR | 10-20160085457 A | 7/2016 |
| KR | 10-1860923 B1 | 5/2018 |
| TW | 511197 B | 11/2002 |
| TW | 201202709 A | 1/2012 |
| TW | 201411135 A | 3/2014 |
| TW | 201741675 A | 12/2017 |
| TW | 201902044 A | 1/2019 |
| WO | WO2017/209357 A1 | 12/2017 |
| WO | WO2018221777 A1 | 12/2018 |

OTHER PUBLICATIONS

Notice of Allowance issued in corresponding Chinese Patent Appln. 201980095769.7 dated May 30, 2024, with translation.

First OA issued in corresponding Chinese Patent Appln. No. 201980095769.7 dated Oct. 25, 2023.

He Zhan-shu, et al, Insertion extration and temperature rise properties of electrical connector(J), Journal of South China University of Technology (natural science edition), 2017, 45(4): 59-65+80.

* cited by examiner (B)

(A)

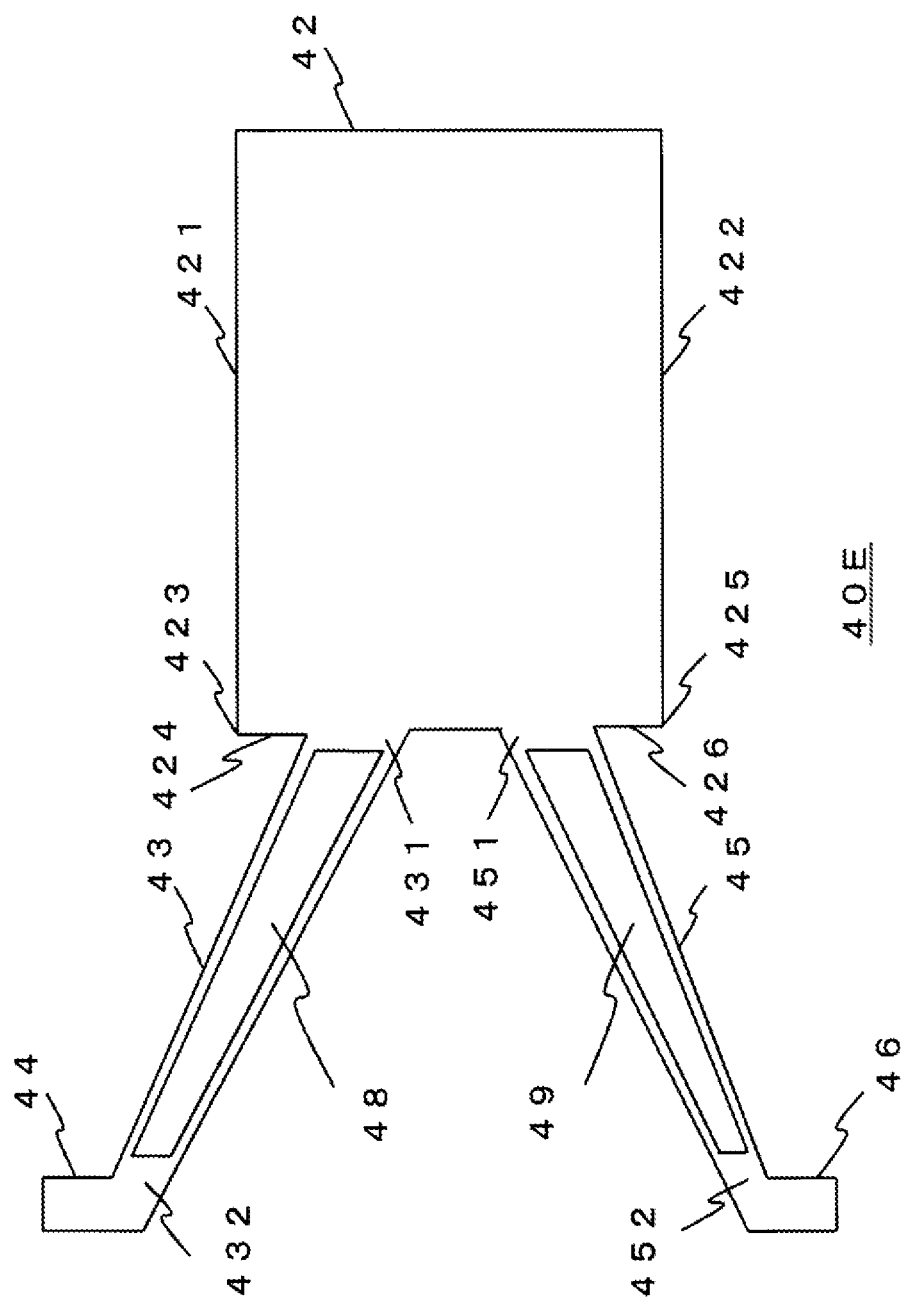
FIG.12
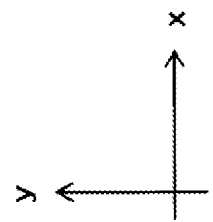

ELECTRICAL CONTACTOR AND ELECTRICAL CONNECTING APPARATUS

CROSS-REFERENCE TO RELATED APPLICATIONS

The present application claims, under 35 USC 119, priority of Japanese Patent Application No. 2019-085504 filed on Apr. 26, 2019.

TECHNICAL FIELD

The present disclosure relates to an electrical contactor and an electrical connecting apparatus, and is applicable to, for example, an electrical contactor and an electrical connecting apparatus to be used for an energization test of an integrated circuit or inspection object on a semiconductor wafer.

BACKGROUND ART

Inspection objects such as an integrated circuit that is formed on a semiconductor wafer, a packaged integrated circuit, and the like are subjected to an electrical characteristic inspection at each manufacturing step. An electrical connecting apparatus such as a probe card is used for the electrical inspection on the integrated circuit on the semiconductor wafer, and an electrical connecting apparatus such as a socket is used for the electrical inspection on the packaged integrated circuit. In such electrical connecting apparatus, an electrical contactor that contacts a first contact object and a second contact object is used, and an electrical signal is conducted between the first contact object and the second contact object via the electrical contactor.

The prior art uses various electrical contactors, and there is an electrical contactor that is formed by combining a plurality of components. When such electrical contactor formed with a plurality of components is used to conduct an electrical signal between a first contact object and a second contact object, resistance becomes large at portions where the components contact one another, and conductivity may be affected.

Patent Literature 1 discloses a spring probe in which a spiral cylindrical sleeve, a first terminal on one end of the cylindrical sleeve, and a second terminal on the other end of the cylindrical sleeve, are integrally formed by bending of a thin belt-like substrate. Since such spring probe is integrally formed with the thin belt-like substrate, good conductivity is achieved.

CITATION LIST

Patent Literature

Patent Literature 1: JP 2011-12992

SUMMARY OF INVENTION

Problem to be Solved

However, since the spring probe described in Patent Literature 1 forms the cylindrical sleeve by bending a flat plate into a spiral shape, there is a problem in that when the first terminal and the second terminal contact a contact object and a load is worked thereon, a sliding property of the cylindrical sleeve is not enough, and good elastic force may not be obtained, or adjustment of elastic force of the cylindrical sleeve is difficult. As a result, a stable electrical contact property with respect to the contact object may not be obtained.

Thus, in view of the above-described problem, the present disclosure intends to provide an electrical contactor and an electrical connecting apparatus that is formed with a small number of components such that a sliding property of an elastic member can be improved, elastic force can be controlled in accordance with a characteristic of a contact object, and electrical contact stability with the contact object can be improved, in order to improve conductivity.

Means for Solving Problem

In order to solve such problem, an electrical contactor according to a first present disclosure is an electrical contactor that is formed with a plate member having conductivity, characterized in that the plate member includes a main body part, an upper arm part having a tapered shape that extends obliquely upward from one end part of the above-described main body part, a first tip part that is provided at a tip of the above-described upper arm part, a lower arm part having a tapered shape that extends obliquely downward from one end part of the above-described main body part, and a second tip part that is provided at a tip of the above-described lower arm part. Furthermore, the electrical contactor includes a first contact part that is formed by winding the above-described first tip part and that contacts a first contact object, a first elastic part that is formed by winding the above-described upper arm part having the above-described tapered shape, and is formed such that an upper end part of the above-described upper arm part on the outside covers an outer circumference of a lower end part of the above-described upper arm part on the inside, a second contact part that is formed by winding the above-described second tip part and that contacts a second contact object, a second elastic part that is formed by winding the above-described lower arm part having the above-described tapered shape, and is formed such that a lower end part of the above-described lower arm part on the outside covers an outer circumference of an upper end part of the above-described lower arm part on the inside, and a cylindrical part that is formed by winding the above-described main body part, containing inside a base end part of the above-described first elastic part and a base end part of the above-described second elastic part.

An electrical contactor according to a second present disclosure is an electrical contactor that is formed with a plate member having conductivity, characterized in that the above-described plate member includes a main body part, an upper arm part having a tapered shape that extends obliquely upward from one end part of the above-described main body part, a tip part that is provided at a tip of the above-described upper arm part, and a plurality of mountain-like projecting parts that are provided at a lower end part of the above-described main body part. Furthermore, the electrical contactor includes a first contact part that is formed by winding the above-described tip part and that contacts a first contact object, an elastic part that is formed by winding the above-described upper arm part having the above-described tapered shape, and is formed such that an upper end part of the above-described upper arm part on the outside covers an outer circumference of a lower end part of the above-described upper arm part on the inside, and a cylindrical part that is formed by winding the above-described main body part, containing inside a base end part of the above-described elastic part and contacting a second contact object with the above-described mountain-like projecting parts at the lower end part.

An electrical connecting apparatus according to a third present disclosure is an electrical connecting apparatus including a plurality of electrical contactors to be brought into contact with a first contact object and a second contact object, characterized in that the electrical contactors are the electrical contactors according to the first or the second present disclosure.

Advantageous Effects of Invention

According to the present disclosure, in order to improve conductivity, a small number of components is used for the formation, and a sliding property of an elastic member can be improved. Furthermore, elastic force can be controlled in accordance with a characteristic of a contact object, and electrical contact stability with the contact object can be improved.

BRIEF DESCRIPTION OF DRAWINGS

FIG. 12 shows the configuration of an electrical contactor and the configuration of a plate member according to a fifth embodiment (No. 1).

BRIEF DESCRIPTION OF EMBODIMENTS (A) First Embodiment

A first embodiment of an electrical contactor and an electrical connecting apparatus according to the present disclosure will now be described in detail with reference to the drawings.

This embodiment illustrates a case in which the electrical contactor according to the present disclosure is applied to a connector to be mounted on an electrical connecting unit that is a structural member of the electrical connecting apparatus, as will be described later. The electrical contactor according to the present disclosure is not limited to the following embodiments. The electrical contactor according to the present disclosure can be applied to an electrical contactor for electrically contacting a first contact object and a second contact object such that an electrical signal can be conducted between the first contact object and the second contact object.

In addition, this embodiment illustrates a case in which the electrical connecting apparatus according to the present disclosure is applied to an electrical connecting apparatus to be used for an electrical inspection of an inspection object, wherein an integrated circuit that is formed on a semiconductor wafer is set as the inspection object. The electrical connecting apparatus according to the present disclosure can be applied to an electrical connecting apparatus that conducts an electrical signal between a first contact object and a second contact object for an electrical connection therebetween, using the electrical contactor according to the present disclosure.

(A-1) Configuration of First Embodiment (A-1-1) Electrical Connecting Apparatus

Figure 3:
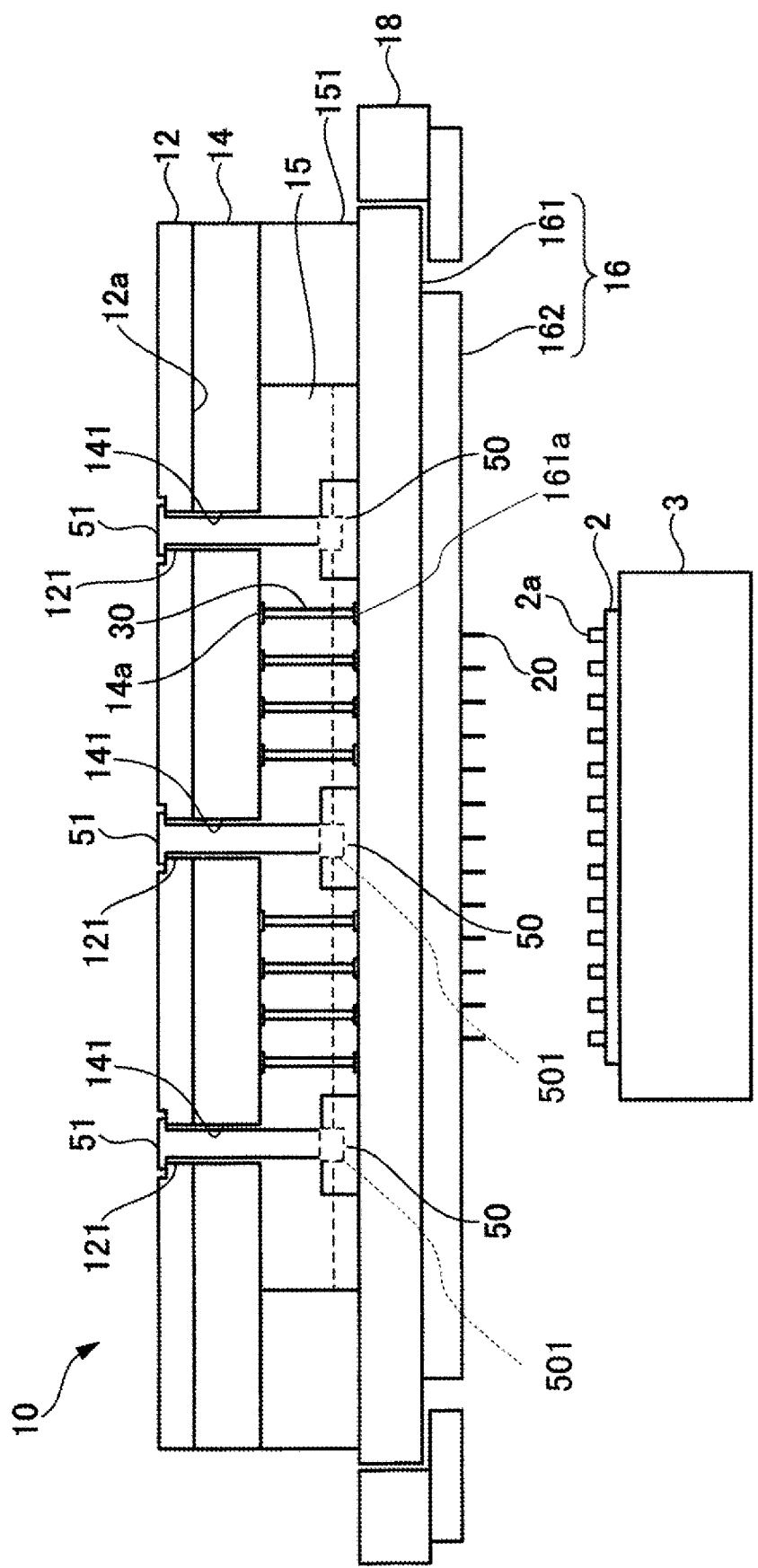
FIG. 3 shows the configuration of an electrical connecting apparatus according to the first embodiment.

FIG. 3 shows the configuration of the electrical connecting apparatus according to the first embodiment. Although an electrical connecting apparatus 10 in FIG. 3 illustrates main structural members, the electrical connecting apparatus 10 is not limited to those structural members. Actually, structural members not illustrated in FIG. 3 are also provided. Furthermore, in the following, "upper" and "lower" will be referred to by focusing on the vertical direction in FIG. 3.

In FIG. 3, the electrical connecting apparatus 10 according to this embodiment has a flat support member 12, a flat wiring substrate 14 that is retained on a lower surface 12a of the above-described support member 12, an electrical connecting unit 15 to be electrically connected with the above-described wiring substrate 14, and a probe substrate 16 being electrically connected with the above-described electrical connecting unit 15 and having a plurality of probes 20.

The electrical connecting apparatus 10 uses multiple fixing member (for example, screwing members such as bolts) when assembling the support member 12, the wiring substrate 14, the electrical connecting unit 15, and the probe substrate 16. However, FIG. 3 does not illustrate these fixing members.

The electrical connecting apparatus 10 sets, for example, a semiconductor integrated circuit or the like that is formed on a semiconductor wafer as an inspection object 2, and performs an electrical inspection on the inspection object 2. Specifically, the inspection object 2 is pressed toward the probe substrate 16, and a tip part of each probe 20 of the probe substrate 16 is brought into electrical contact with an electrode terminal 2a of the inspection object 2. An electrical signal is supplied to the electrode terminal 2a of the inspection object 2 from a tester (inspection device) not illustrated, and the electrical signal from the electrode terminal 2a of the inspection object 2 is given to the tester side, thereby performing the electrical inspection on the inspection object 2.

The inspection object 2, which is an inspection target, is placed on an upper surface of a chuck top 3. The chuck top 3 is capable of adjusting positions in a X-axis direction in the horizontal direction, a Y-axis direction that is vertical to the X-axis direction on a horizontal plane, and a Z-axis direction that is vertical to the horizontal plane (X-Y plane). Furthermore, rotating postures can be adjusted in a θ direction around the Z axis. When performing the electrical inspection on the inspection object 2, a chuck that is capable of elevating in the vertical direction (Z-axis direction) is moved, and a lower surface of the probe substrate 16 of the electrical connecting apparatus 10 and the inspection object 2 on an upper surface of the chuck top 3 are moved to become relatively closer in order to bring the electrode terminal 2a of the inspection object 2 into electrical contact with the tip part of each probe 20 of the probe substrate 16.

[Support Member]

The support member 12 suppresses deformation (for example, deflection or the like) of the wiring substrate 14. For example, since the probe substrate 16 has the multiple probes 20, the weight of the probe substrate 16 to be attached to the wiring substrate 14 side is large. In addition, when performing the electrical inspection on the inspection object 2, the probe substrate 16 is pressed against the inspection object 2 on the chuck top 3 such that the tip part of the probe 20 that is projected to the lower surface of the probe substrate 16 contacts the electrode terminal 2a of the inspection object 2. In this manner, at the time of the electrical inspection, a large load is also applied to the wiring substrate 14 due to the action of reaction force (contact load) that is pushed up from bottom to top. The support member 12 functions as a member for suppressing deformation (for example, deflection or the like) of the wiring substrate 14.

In addition, the support member 12 is provided with a plurality of through holes 121 that penetrate the upper surface and the lower surface. Each of the through holes 121 is provided at a position corresponding to each of the positions of a plurality of anchors 50 disposed on the upper surface of the probe substrate 16, which will be described later, and at a position corresponding to each of a plurality of through holes 141 provided for the wiring substrate 14.

A spacer (hereinafter, also referred to as the "support part") 51 is inserted through each through hole 121 of the support member 12 from the top toward the bottom of the support member 12, and is configured such that a lower end part of the spacer (support part) 51 is fixable with the corresponding anchor 50. For example, the lower end part of the spacer (support part) 51 is a male screw part, and approximately the center part of the anchor 50 disposed on the upper surface of the probe substrate 16 is a female screw part 501. Fixing can be performed by screwing the lower end part (male screw part) of the spacer (support part) 51 to the female screw part of the anchor 50. In this manner, the distance between the upper surface of the probe substrate 16 and the upper surface of the support member 12 can be retained at a predetermined distance length.

[Wiring Substrate]

The wiring substrate 14 is made of, for example, a resin material such as polyimide, and is, for example, a printed substrate or the like that is formed in a substantially circular plate shape. Multiple electrode terminals (not illustrated) for an electrical connection with a test head (not illustrated) of a tester (inspection device) are disposed in the periphery of the upper surface of the wiring substrate 14. In addition, a wiring pattern is formed on the lower surface of the wiring substrate 14, and a connecting terminal 14a of the wiring pattern electrically connects to an upper end part of the connector 30 such as a pogo pin that is provided for the electrical connecting unit 15.

Furthermore, a wiring circuit (not illustrated) is formed inside the wiring substrate 14, and the wiring pattern on the lower surface of the wiring substrate 14 and the electrode terminal on the upper surface of the wiring substrate 14 are connectable through the wiring circuit inside the wiring substrate 14. Accordingly, an electrical signal can be conducted between each connector 30 of the electrical connecting unit 15 to be electrically connected with the connecting terminal 14a of the wiring pattern on the lower surface of the wiring substrate 14, and the test head to be connected with the electrode terminal on the upper surface of the wiring substrate 14, through the wiring circuit inside the wiring substrate 14. A plurality of electronic components that are necessary for the electrical inspection of the inspection object 2 are disposed on the upper surface of the wiring substrate 14.

In addition, the wiring substrate 14 is provided with the through holes 141 penetrating the upper surface and the lower surface of the wiring substrate 14. Each of the through holes 141 is disposed at a position corresponding to each of the positions of the anchors 50 disposed on the upper surface of the probe substrate 16, and at a position corresponding to each of the through holes 121 of the support member 12.

The opening shape of each through hole 141 may be a shape corresponding to the shape of the inserted support part 51. In addition, in order to allow insertion of the support part 51 into each through hole 141, an inner diameter of each through hole 141 is about the same as or slightly larger than an outer diameter of the support part 51.

Since the support part 51 is a columnar member in this embodiment, a case in which the opening shape of the through hole 141 is substantially a circle is illustrated. However, the opening shape is not limited thereto. For example, a right prism member in which a cross-sectional shape of the support part 51 is substantially a square or the like, a polygonal prism member in which the cross-sectional shape is a polygon, and the like may also be used. Furthermore, also in such cases, the opening shape of the through hole 141 may be a shape into which the support part 51 can be inserted.

[Electrical Connecting Unit]

The electrical connecting unit 15 has a plurality of the connectors 30 such as, for example, pogo pins. In an assembled state of the electrical connecting apparatus 10, the upper end part of each connector 30 is electrically connected with the connecting terminal 14a of the wiring pattern on the lower surface of the wiring substrate 14, and the lower end part of each connector 30 is connected with a pad that is provided on the upper surface of the probe substrate 16. Since the tip part of the probe 20 electrically contacts the electrode terminal of the inspection object 2, the electrode terminal of the inspection object 2 is electrically connected with a tester (inspection device) through the probe 20 and the connector 30, and thus the inspection object 2 can be electrically inspected with the tester (inspection device).

For example, the electrical connecting unit 15 has a plurality of insertion holes for inserting each connector 30, and the upper end part and the lower end part of each connector 30 project by inserting the connector 30 into each insertion hole. In the electrical connecting unit 15, a mechanism of mounting the connectors 30 is not limited to the configuration of providing through holes, and various configurations can be widely applied. A flange part 151 is provided in the periphery of the electrical connecting unit 15.

[Probe Substrate]

The probe substrate 16 is a substrate having the probes 20, and is formed in a substantially circular shape of polygonal shape (for example, hexadecagon or the like). For example, a cantilever type probe or the like may be used for the probe 20, but the probe 20 is not limited thereto. In addition, the probe substrate 16 has a substrate member 161 that is formed with, for example, a ceramic board, and a multilayer wiring substrate 162 that is formed on the lower surface of this substrate member 161.

Multiple conduction paths (not illustrated) penetrating in the thickness direction are formed inside the substrate member 161, which is a ceramic substrate, and a pad 161a is formed on the upper surface of the substrate member 161. One end of the conduction path inside the substrate member 161 is formed so as to connect to the corresponding pad 161a on the upper surface of the substrate member 161. Furthermore, on the lower surface of the substrate member 161, the other ends of the conduction path inside the substrate member 161 is formed so as to connect to the connecting terminal provided on the upper surface of the multilayer wiring substrate 162.

The multilayer wiring substrate 162 is formed with a plurality of multilayer substrates that are formed with, for example, a synthetic resin member such as polyimide, and a wiring path (not illustrated) is formed among the multilayer substrates. One end of the wiring path in the multilayer wiring substrate 162 is connected to the other end of the conduction path on the substrate member 161 side, which is a ceramic substrate, and the other end of the multilayer wiring substrate 162 is connected to a probe land that is provided on the lower surface of the multilayer wiring substrate 162. The probes 20 are disposed in the probe land provided on the lower surface of the multilayer wiring substrate 162, and the probes 20 of the probe substrate 16 are electrically connected with the corresponding connecting terminal 14a of the wiring substrate 14 via the electrical connecting unit 15.

(A-1-2) Connector (Electrical Contactor)

Figure 1:
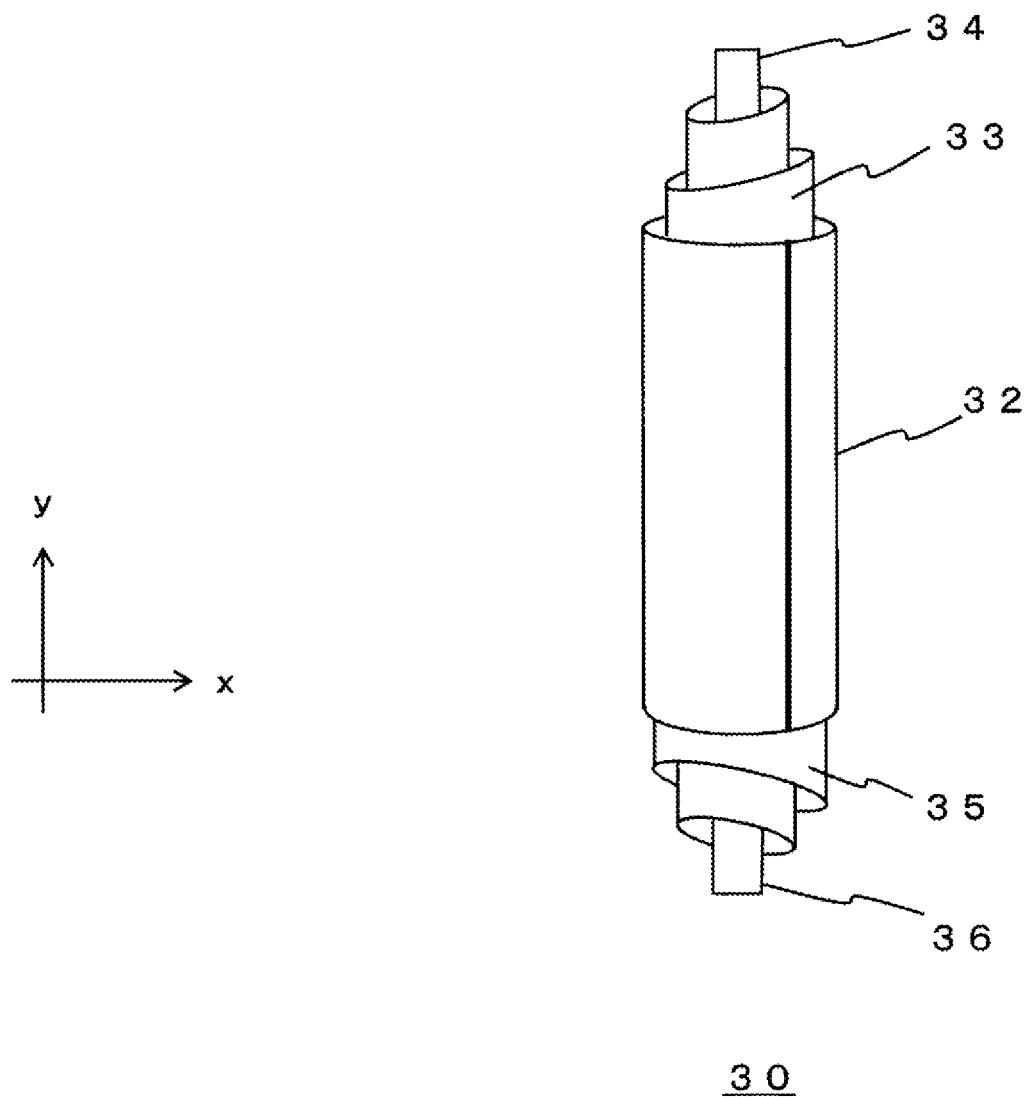
FIG. 1 shows the configuration of a connector according to a first embodiment.
Figure 2:
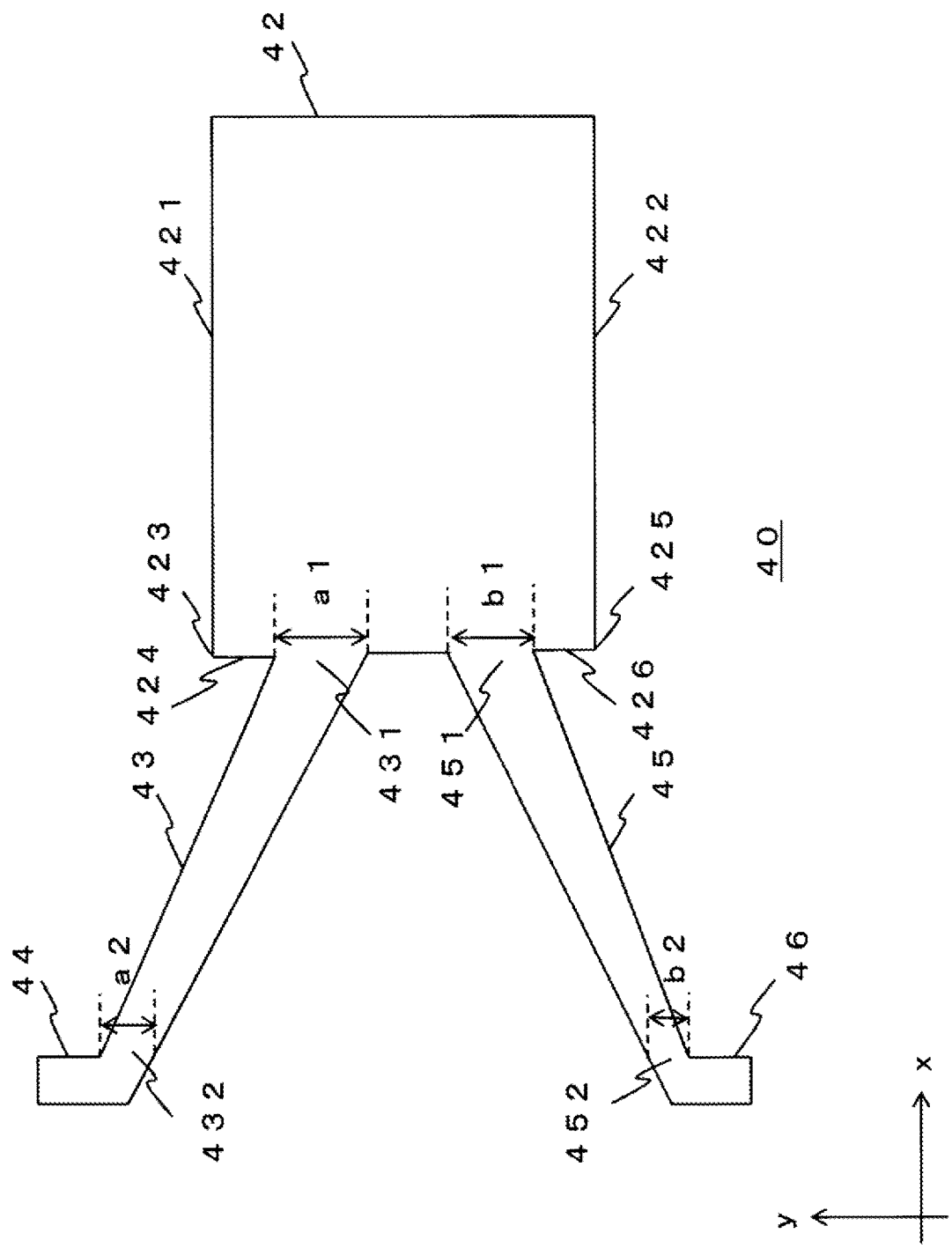
FIG. 2 shows the configuration of a plate member before the formation of the connector according to the first embodiment.

FIG. 1 shows the configuration of the connector 30 according to the first embodiment. FIG. 2 shows the configuration of a plate member before the formation of the connector 30 according to the first embodiment.

As illustrated in FIG. 1, the connector 30 as an example of the electrical contactor according to the present disclosure includes a cylindrical part 32, a first contact part 34 that contacts the connecting terminal 14a of the wiring substrate 14 as a first contact object, an upper elastic part 33 that is elastically energized in the vertical direction when the first contact part 34 contacts the connecting terminal 14a and receives a load, a second contact part 36 that contacts the pad 161a of the substrate member 161 as a second contact object, and a lower elastic part 35 that is elastically energized in the vertical direction when the second contact part 36 contacts the pad 161a and receives a load.

The connector 30 in FIG. 1 is formed by molding processing (for example, rounding molding, bending, or the like) of the plate member 40 in FIG. 2. That is to say, the plate member 40 in FIG. 2 is a member before the molding processing of the connector 30 in FIG. 1, and is a plate-like member that is formed with a conductive material. Accordingly, since the connector 30 is formed by the molding processing of the plate member formed with the conductive material, conductivity of the electrical signal can be stabilized. In other words, in an electrical contactor that is formed by combining a plurality of components, an electrical signal is conducted by contact of the components with one another, and thus resistance becomes large at portions where the components contact one another, and conductivity becomes unstable. In contrast, in the connector 30 formed by molding processing of the plate-like member, there are no or few portions where the components contact one another, and thus conductivity of the electrical signal can be stabilized.

The plate member 40 is, for example, a plate member that is formed with noble metal or metal, or is a plate member that is obtained by plating a surface of a plate-like member with noble metal or metal, and is formed by performing punching or the like on the plate-like member. In addition, for example, in the plate member 40, portions (a first tip part 44 and/or a second tip part 46, which will be described later) contacting the first contact object or the second contact object may be noble metal or the like, and other portions may be formed with a member having excellent elasticity (for example, spring property) such as bimetal. In this manner, by using noble metal or the like for the portions contacting the first contact object and/or the second contact object, good conductivity can be obtained, and by using a member such as bimetal for other portions, good elasticity (for example, spring property) can be obtained for those portions.

As illustrated in FIG. 2, the plate member 40 has a main body part 42, an upper arm part 43, the first tip part 44 provided at a tip of the upper arm part 43, a lower arm part 45, and the second tip part 46 provided at a tip of the lower arm part 45.

[Main Body Part]

The main body part 42 is a plate-like portion having a substantially rectangular shape. As will be described later, the plate member 40 is wound from components on the left side by rounding molding to form the connector 30. Once the connector 30 is formed, the main body part 42 is a portion that becomes the cylindrical part 32, which covers the wound upper arm part 43 and the wound lower arm part 45.

In this regard, among the end parts at four sides of the main body part 42, the end parts of the upper end part 421 and the lower end part 422 are linearly formed in a lateral direction, and are formed so as to be parallel to each other. The cylindrical part 32 of the connector 30, which is formed by winding the plate member 40, functions as a positioning part for the connector 30 in the height direction when housing the connector 30. Accordingly, by linearly forming the end parts of the upper end part 421 and the lower end part 422 of the main body part 42 in a parallel manner, a posture of the housed connector 30 can be stabilized.

[Upper Arm Part]

The upper arm part 43 is integrally coupled with one end part (the left side end part in FIG. 2) among the end parts at the four sides of the main body part 42. The upper arm part 43 is positioned at an upper part of the left side end part of the main body part 42, and is a member extending from the left side end part of the main body part 42 to a left oblique upward direction.

The upper arm part 43 may have a tapered shape (taper shape) in which a length in the vertical direction (y direction) becomes smaller from a base end part 431 coupled with the main body part 42, toward the tip side (i.e., the first tip part 44 side), or the upper arm part 43 may have a same width throughout the base end part 431 toward the tip side. In other words, when the length of the base end part 431 of the upper arm part 43 coupled with the main body part 42 in the y direction is denoted "a1", and the length of the tip part 432 of the upper arm part 43 in the y direction is denoted "a2", the relationship is a1≥a2. In this embodiment, descriptions are made by illustrating a case in which the upper arm part 43 has a tapered shape.

In this manner, by shaping the upper arm part 43 in a tapered shape, when the upper arm part 43 is wound by rounding molding, an upper elastic part 33 having, for example, a volute spring shape is formed. That is to say, the upper elastic part 33 formed by winding the upper arm part 43 is in a state in which the lower end part of the wound inner member is covered with the upper end part of the wound outer member. Furthermore, the upper elastic part 33 elastically energizes the first contact part 34 in the vertical direction.

The base end part 431 of the upper arm part 43 extends from a position (a position that is separated from an upper corner part 423) that is slightly below than the upper corner part 423 of the left side end part of the main body part 42. In this regard, a part of the left side end part of the main body part 42 from the upper corner part 423 to the base end part 431 is referred to as a "step part 424". In this manner, by extending the upper arm part 43 from the position in which the step part 424 is provided from the upper corner part 423, when the plate member 40 is wound by rounding molding, the base end part 431 of the wound upper arm part 43 (the upper elastic part 33) will be in a state that is covered with the main body part 42.

In this manner, the connector 30 formed by winding the plate member 40 is housed in the electrical connecting unit 15, and when the first contact part 34 receives a load, the upper elastic part 33 elastically strokes in the vertical direction in a state in which the base end part 431 of the upper elastic part 33 is contained in the cylindrical part 32. Accordingly, the upper elastic part 33, which is elastically driven as a spring, can be prevented from being damaged.

[First Tip Part]

The first tip part 44 is provided at the tip of the upper arm part 43, and is a part that is extended vertically upward. Due to winding of the first tip part 44 by rounding molding, the wound first tip part 44 functions as the first contact part 34 of the connector 30 contacting the first contact object.

[Lower Arm Part]

The lower arm part 45 is integrally coupled with one end part (the left side end part in FIG. 2) among the end parts at the four sides of the main body part 42. The lower arm part 45 is positioned at a lower part of the left side end part of the main body part 42, and is a member extending from the left side end part of the main body part 42 to a left oblique downward direction. A base end part 451 of the lower arm part 45 is positioned below than the position of the base end part 431 of the upper arm part 43, and the base end part 451 of the lower arm part 45 and the base end part 431 of the upper arm part 43 are separated from each other in the left side end part of the main body part 42.

As in the case of the upper arm part 43, the lower arm part 45 may also have a tapered shape (taper shape) in which a length in the vertical direction (y direction) becomes smaller from the base end part 451 coupled with the main body part 42 toward the tip side (i.e., the second tip part 46 side), or the lower arm part 45 may have a same width throughout the base end part 431 toward the tip side. In other words, when the length of the base end part 451 of the lower arm part 45 coupled with the main body part 42 in the y direction is denoted "b1", and the length of the tip part 452 of the lower arm part 45 in the y direction is denoted "b2", the relationship is b1≥b2. In this embodiment, descriptions are made by illustrating a case in which the lower arm part 45 has a tapered shape.

In this manner, by shaping the lower arm part 45 in a tapered shape, when the lower arm part 45 is wound by rounding molding, the lower elastic part 35 having, for example, a volute spring shape is formed. That is to say, the lower elastic part 35 formed by winding the lower arm part 45 is in a state in which the upper end part of the wound inner member is covered with the lower end part of the wound outer member. Furthermore, the lower elastic part 35 elastically energizes the second contact part 36 in the vertical direction.

The base end part 451 of the lower arm part 45 extends from a position (a position that is separated from a lower corner part 425) that is slightly above the lower corner part 425 of the left side end part of the main body part 42. In this regard, a part of the left side end part of the main body part 42 from the lower corner part 425 to the base end part 451 is referred to as a "step part 426". In this manner, by extending the lower arm part 45 from the position in which the step part 426 is provided from the lower corner part 425, when the plate member 40 is wound by rounding molding, the base end part 451 of the wound lower arm part 45 (the lower elastic part 35) will be in a state that is covered with the main body part 42.

In this manner, the connector 30 formed by winding the plate member 40 is housed in the electrical connecting unit 15, and when the second contact part 36 receives a load, the lower elastic part 35 elastically strokes in the vertical direction in a state in which the base end part 451 of the lower elastic part 35 is contained in the cylindrical part 32. Accordingly, the lower elastic part 35, which is elastically driven as a spring, can be prevented from being damaged.

[Second Tip Part]

The second tip part 46 is provided at the tip of the lower arm part 45, and is a part that is extended vertically downward. Due to winding of the second tip part 46 by rounding molding, the wound second tip part 46 functions as the second contact part 36 of the connector 30 contacting the second contact object.

[Manufacturing Method of Connector]

Figure 4:
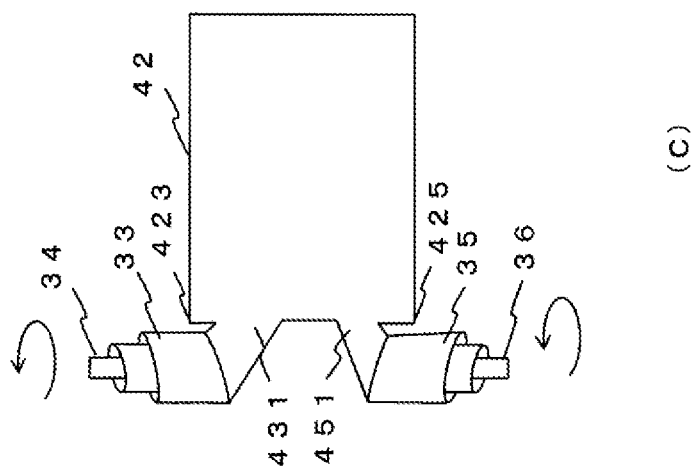
FIG. 4 is an explanatory view for explaining a manufacturing method of a connector according to an embodiment (No. 1).
Figure 4:
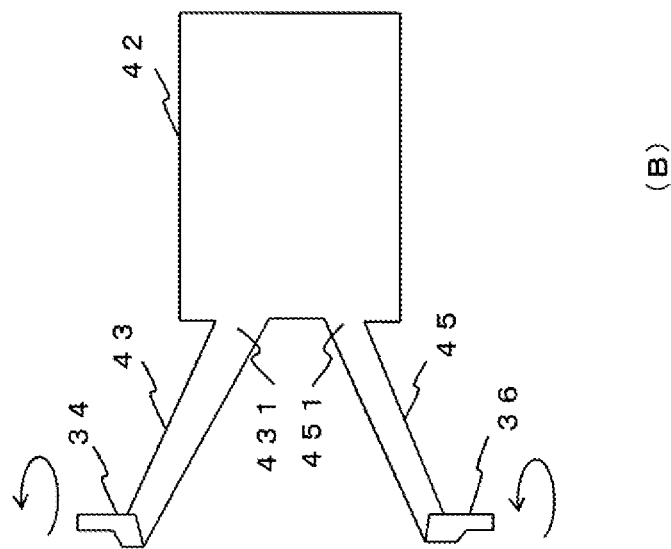
Figure 4:
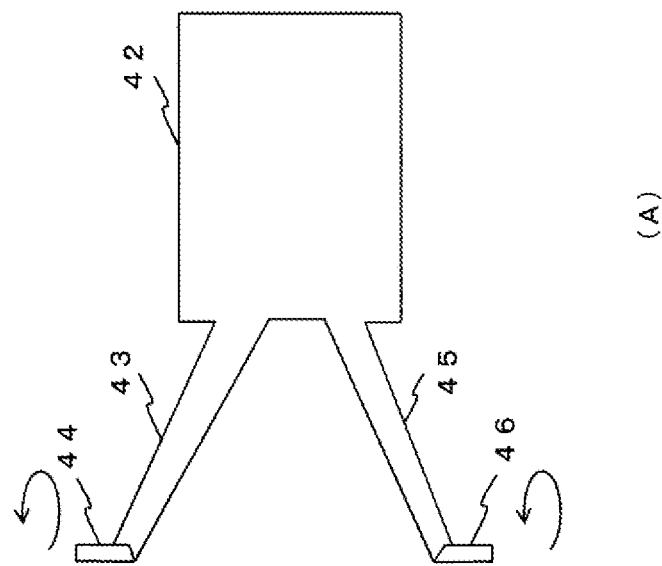
Figure 5:
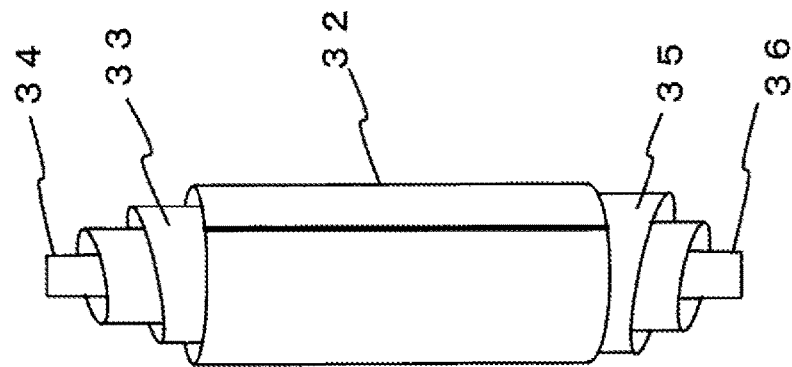
FIG. 5 is an explanatory view for explaining a manufacturing method of a connector according to an embodiment (No. 2).
Figure 5:
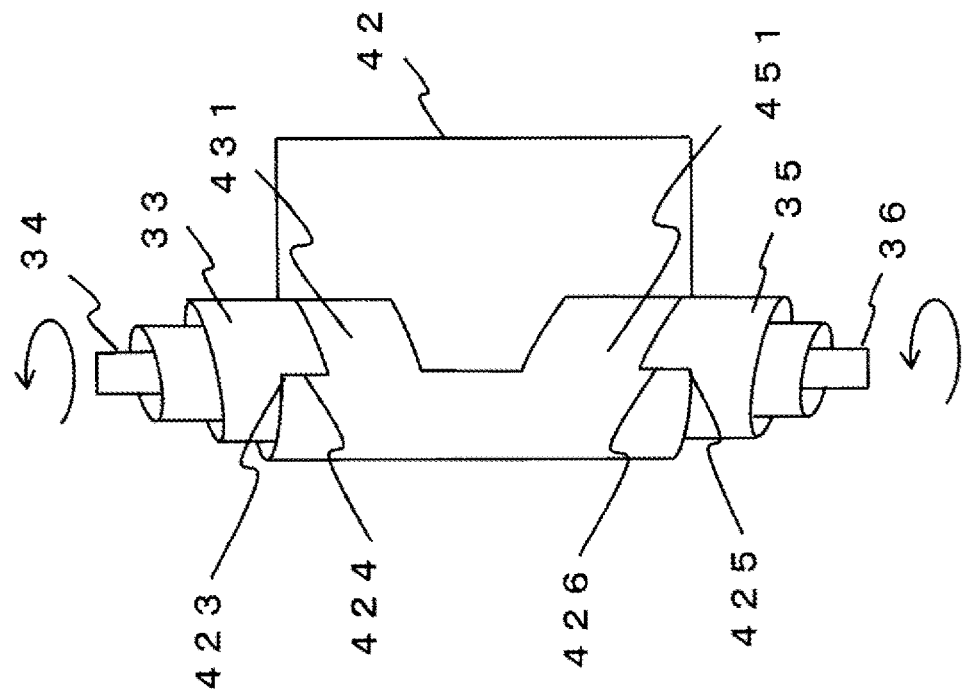

FIG. 4 and FIG. 5 are explanatory views for explaining a manufacturing method of the connector 30 according to an embodiment.

In FIG. 4(A), firstly, rounding molding is performed on the first tip part 44 and the second tip part 46 of the plate member 40, and the first tip part 44 and the second tip part 46 are cylindrically rounded, thereby molding the first contact part 34 and the second contact part 36.

In FIG. 4(B), rounding molding is performed on the upper arm part 43 and the lower arm part 45, and winding is performed from the tip side of the upper arm part 43 and the lower arm part 45 toward the base end parts 431, 451. For example, this embodiment illustrates a case in which winding is performed in a counterclockwise manner in the planar view of FIG. 4 and FIG. 5. At this time, the central axes of winding the upper arm part 43 and the lower arm part 45 may be matched or substantially matched such that the number of turns of the upper arm part 43 and the lower arm part 45 will be the same.

In addition, since the upper arm part 43 and the lower arm part 45 have tapered shapes (taper shapes) from the base end parts 431, 451 toward the tip side, by repeating the winding of the upper arm part 43 and the lower arm part 45, a part of the lower end part of the inner member of the upper elastic part 33 is covered with the upper end part of the outer member, or a part of the upper end part of the inner member of the lower elastic part 35 is covered with the lower end part of the outer member, thereby forming the upper elastic part 33 and the lower elastic part 35.

As illustrated in FIG. 4(C), once the upper arm part 43 and the lower arm part 45 are wound to the base end parts 431, 451, and the upper elastic part 33 and the lower elastic part 35 are formed, rounding molding is further performed on the upper elastic part 33 and the lower elastic part 35, and the base end parts 431, 451 of the upper elastic part 33 and the lower elastic part 35 are cylindrically rounded so as to be wrapped by the main body part 42.

As illustrated in FIG. 5(A), since the base end part 431 of the upper arm part 43 extends from the position at which the step part 424 is provided from the upper corner part 423, and the base end part 451 of the lower arm part 45 extends from the position at which the step part 426 is provided from the lower corner part 425, the base end parts 431, 451 of the upper elastic part 33 and the lower elastic part 35 become a state covered by the inside of the cylindrical wound main body part 42.

Furthermore, as illustrated in FIG. 5(B), when the remaining part of the main body part 42 is wound and the cylindrical part 32 is formed, the connector 30 is formed. In this manner, since the connector 30 is molded by winding the plate member 40, which is a conductive material, conductivity of an electrical signal can be stabilized. The end part of the main body part 42 may be fixed to the surface of the main body part 42 on the inner side. That is to say, in order to retain an outer shape structure of the cylindrical part 32 formed by winding the main body part 42, one or a plurality of portions at which the end part of the main body part 42 contacts the cylindrical part 32 may be fixed with, for example, welding, an adhesive agent, or the like. The fixing method of the outer shape structure of the cylindrical part 32 is not limited to welding or an adhesive agent, and caulking or the like may be performed.

Figure 6:
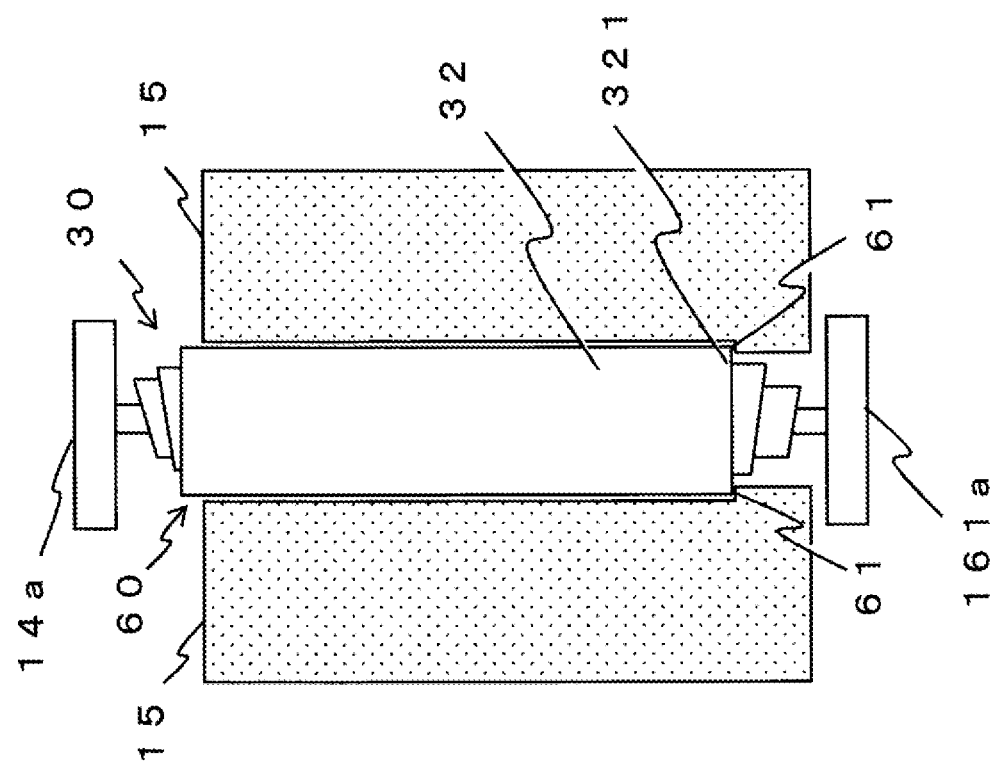
FIG. 6 shows the connector according to the first embodiment in its housing state and a load receiving state.
Figure 6:
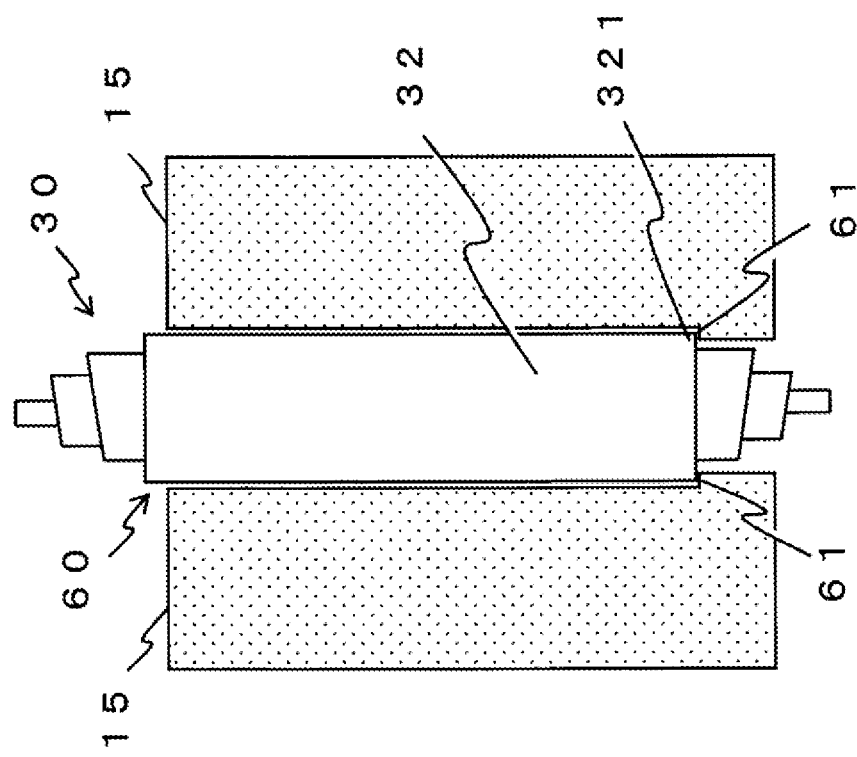

FIG. 6 illustrates a housing state and a load receiving state of the connector 30 according to the first embodiment. The housing method and the housing structure of the connector 30 are examples, and are not limited to the structure in FIG. 6.

In the example of FIG. 6(A), the electrical connecting unit 15 is provided with a through hole 60 for inserting the connector 30, and the connector 30 is inserted through the through hole 60. An inner diameter of the through hole 60 is slightly larger than or about the same as an outer shape of the connector 30. In addition, a lower part of the through hole 60 has an inner diameter that is slightly smaller than an inner diameter of an upper part of the through hole 60, and a step is provided on an inner surface of the through hole 60. A lower end part 321 of the cylindrical part 32 of the inserted connector 30 is supported by this step on the inner surface of the through hole 60. Since the lower end part 321 of the cylindrical part 32 of the connector 30 is a flat end surface, the inserted connector 30 is contained at a stable posture.

As illustrated in FIG. 6(B), when the connector 30 is inserted through the through hole 60, and the connecting terminal 14a, which is the first contact object, contacts the first contact part 34 and receives a load, the upper elastic part 33 shows elasticity in the vertical direction. When the pad 161a, which is the second contact object, contacts the second contact part 36 and receives a load, the lower elastic part 35 shows elasticity in the vertical direction.

The upper elastic part 33 and the lower elastic part 35 at both ends in an axial direction (the vertical direction) of the connector 30, which is the electrical contactor, are formed asymmetric to each other. Thus, the upper elastic part 33 and the lower elastic part 35 have elasticity in the vertical direction independent from each other.

In addition, since the base end parts 431, 451 of the upper elastic part 33 and the lower elastic part 35 functioning as volute springs exist inside the cylindrical part 32, the upper elastic part 33 and the lower elastic part 35 receiving a load will show elasticity in the vertical direction by using the base end parts 431, 451 inside the cylindrical part 32 as ends of spring functions. In this manner, the cylindrical part 32 can regulate strokes of movements in the vertical direction of the upper elastic part 33 and the lower elastic part 35 receiving a load. Thus, the upper elastic part 33 and the lower elastic part 35 as spring functions can be prevented from being damaged.

In addition, by adjusting height lengths in the vertical direction of the upper elastic part 33 and the lower elastic part 35 projected from the cylindrical part 32, the strokes of the upper elastic part 33 and the lower elastic part 35 when receiving a load can be adjusted. In other words, since the movable stroke is large, the level of energizing force of the connector 30 can be widely set in accordance with the degree of a contact load with a contact object.

Furthermore, since the length (height) of the cylindrical part 32 in the vertical direction does not change, positioning of the connector 30 in the height direction can be ensured.

In addition, since the upper elastic part 33 and the lower elastic part 35 function as volute springs, sliding properties of the upper elastic part 33 and the lower elastic part 35 working in the vertical direction where a load is received, can be improved. That is to say, when the connector is formed with a plurality of components, a load acts among the components and elasticity is shown in the vertical direction, and thus sliding failure may occur. However, since the connector 30 of this embodiment has a structure in which the number of components is decreased than the prior art, the sliding property is improved.

(A-2) Effect of First Embodiment

As described above, the electrical contactor (connector) of this embodiment is formed with a fewer number of components than the prior art. Thus, the sliding property can be improved, and electrical contact stability with a contact object can be improved.

(B) Second Embodiment

Next, a second embodiment of the electrical contactor and the electrical connecting apparatus according to the present disclosure will be described in detail with reference to the drawings.

(B-1) Configuration of Second Embodiment

The first embodiment described above illustrated a case in which the electrical contactor according to the present disclosure is applied to a connector to be installed in an electrical connecting unit of an electrical connecting apparatus for performing an electrical inspection on an integrated circuit on a semiconductor wafer. In this case, a contact object of the electrical contactor is often a flat pad, a terminal, and the like.

However, the electrical contactor according to the present disclosure may be applied to a probe to be installed in a socket such as a test socket for use in an electrical inspection on a packaged integrated circuit. In that case, the contact object of the electrical contactor may be in, for example, a semispherical shape such as a solder ball.

Thus, the second embodiment describes an electrical contactor that is applicable to a case in which the contact object is a solder ball or the like, with reference to the drawings.

Figure 7:
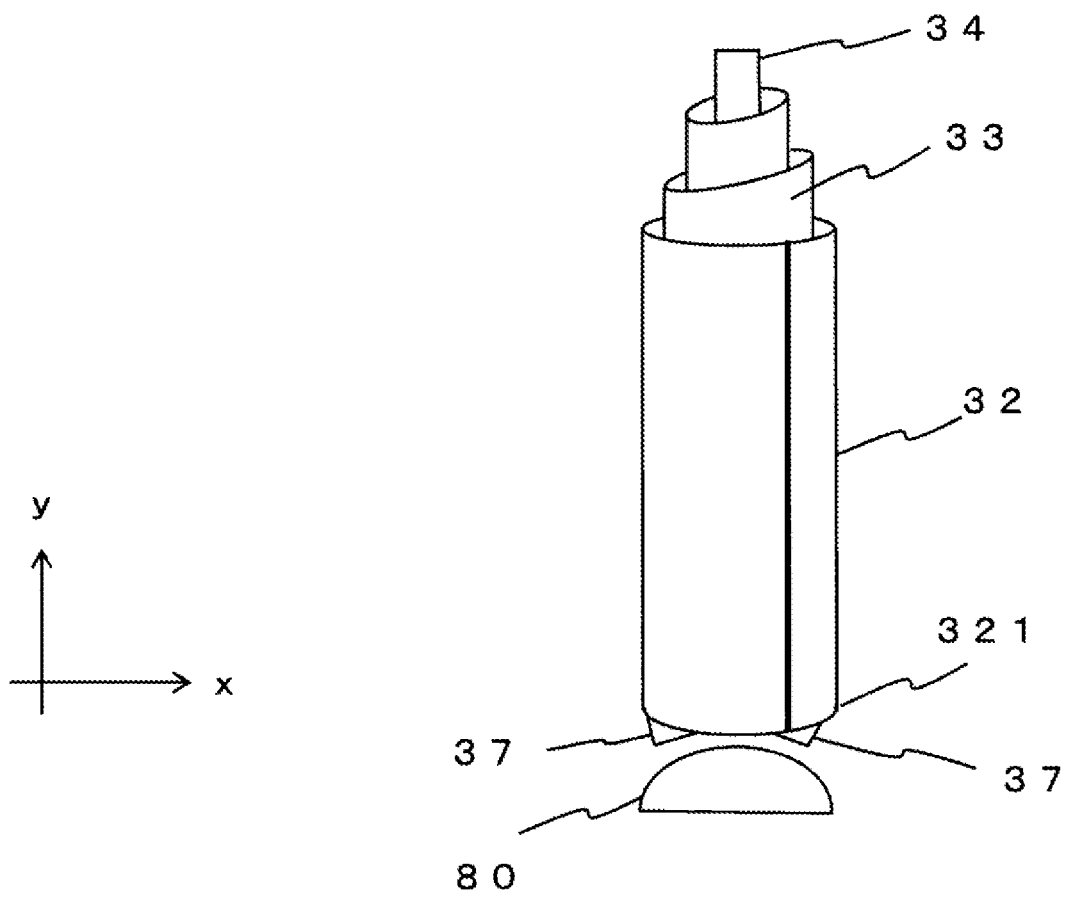
FIG. 7 shows the configuration of an electrical contactor according to a second embodiment.
Figure 8:
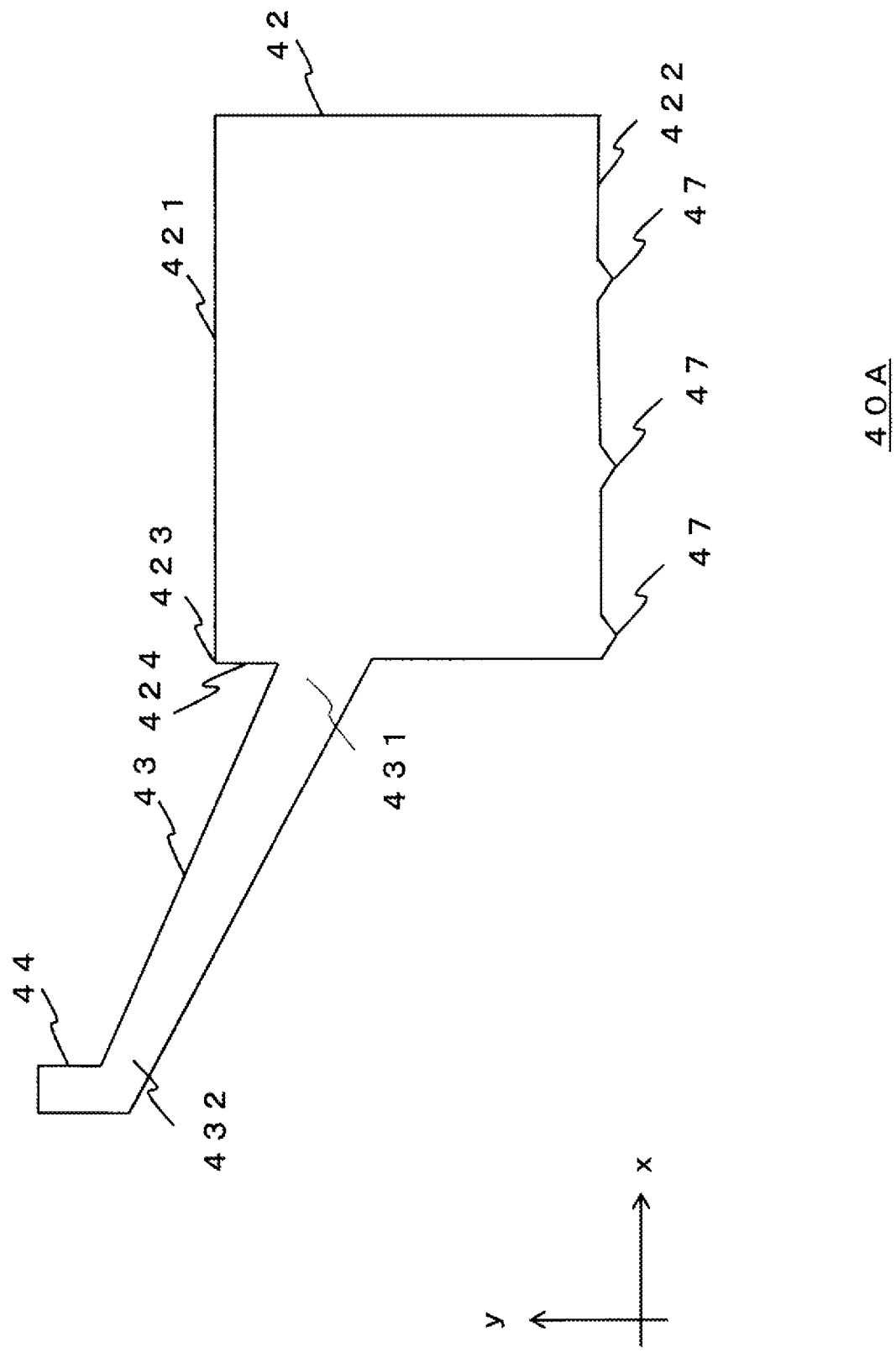
FIG. 8 shows the configuration of a plate member before the formation of the electrical contactor according to the second embodiment.

FIG. 7 shows the configuration of an electrical contactor 30A according to the second embodiment. FIG. 8 shows the configuration of a plate member before the formation of the electrical contactor 30A according to the second embodiment.

As illustrated in FIG. 7, the electrical contactor 30A according to the second embodiment has the cylindrical part 32, the first contact part 34 contacting the connecting terminal 14a of the wiring substrate 14 as the first contact object, the upper elastic part 33 elastically energized in the vertical direction when the first contact part 34 contacts the connecting terminal 14a and a load is received, and a plurality of second contact parts 37 in the lower end part 321 of the cylindrical part 32.

As illustrated in FIG. 8, the plate member 40A has the main body part 42, the upper arm part 43, the first tip part 44 provided at the tip of the upper arm part 43, and a plurality of mountain-like projecting parts 47 that are mountain-shaped projecting parts at the lower end part 422 of the main body part 42. As in the case of the first embodiment, the plate member 40A is, for example, a plate member that is formed with noble metal or metal, or is a plate member that is obtained by plating a surface of a plate-like member with noble metal or metal, and is formed by performing punching or the like on the plate-like member. In addition, for example, in the plate member 40A, portions contacting the first contact object and/or the second contact object may be noble metal or the like, and other portions may be formed with a member having excellent elasticity (for example, spring property) such as bimetal.

The electrical contactor 30A in FIG. 7 is formed by performing molding (rounding molding) on the plate member 40A in FIG. 8, and winding and rolling the plate member 40A. Once the plate member 40A is wound and the electrical contactor 30A is formed, the lower end part 321 and the second contact parts 37 of the cylindrical part 32 function as crown-shaped contact parts.

A manufacturing method of forming the electrical contactor 30A in FIG. 7 by performing rounding molding on the plate member 40A in FIG. 8 is basically the same as the first embodiment. Thus, detailed descriptions of the manufacturing method are omitted here.

The examples of FIG. 7 and FIG. 8 illustrate a case in which three mountain-like projecting parts 47 are provided. However, the number of the mountain-like projecting parts 47 is not particularly limited, and two or four and more of them may be provided. In addition, an installation interval of the mountain-like projecting parts 47 may be determined in accordance with the size (outer shape) and the like of a solder ball to be used as the contact object.

As illustrated in FIG. 7 and FIG. 8, the second contact parts 37 are provided as mountain-shaped projecting parts (protrusion parts) at the lower end part 321 of the cylindrical part 32. By using such shapes, the second contact parts (mountain-like projecting parts 47) 37 and the lower end part 321 of the cylindrical part 32 can electrically contact a solder ball 80, and by providing the second contact parts (mountain-like projecting parts 47) 37 at the lower end part 321 of the cylindrical part 32, the second contact parts (mountain-like projecting parts 47) 37 hit (pierce) a surface of the solder ball 80 and an electrical contact property can be ensured.

In addition, although the above-described example illustrated a case in which the second contact parts 37 as the mountain-like projecting parts 47 are at the lower end part 321 of the cylindrical part 32, the second contact parts 37 as the mountain-like projecting parts 47 may be provided at the upper end part of the cylindrical part 32 in accordance with the mode of contact with the contact object.

(B-2) Effect of Second Embodiment

As described above, according to the second embodiment, in addition to the effect described in the first embodiment, the contact object is a semispherical object such as a solder ball, and an electrical contact property with the contact object can be ensured.

(C) Third Embodiment

Next, a third embodiment of the electrical contactor and the electrical connecting apparatus according to the present disclosure will be described in detail with reference to the drawings.

(C-1) Configuration of Third Embodiment

Figure 9:
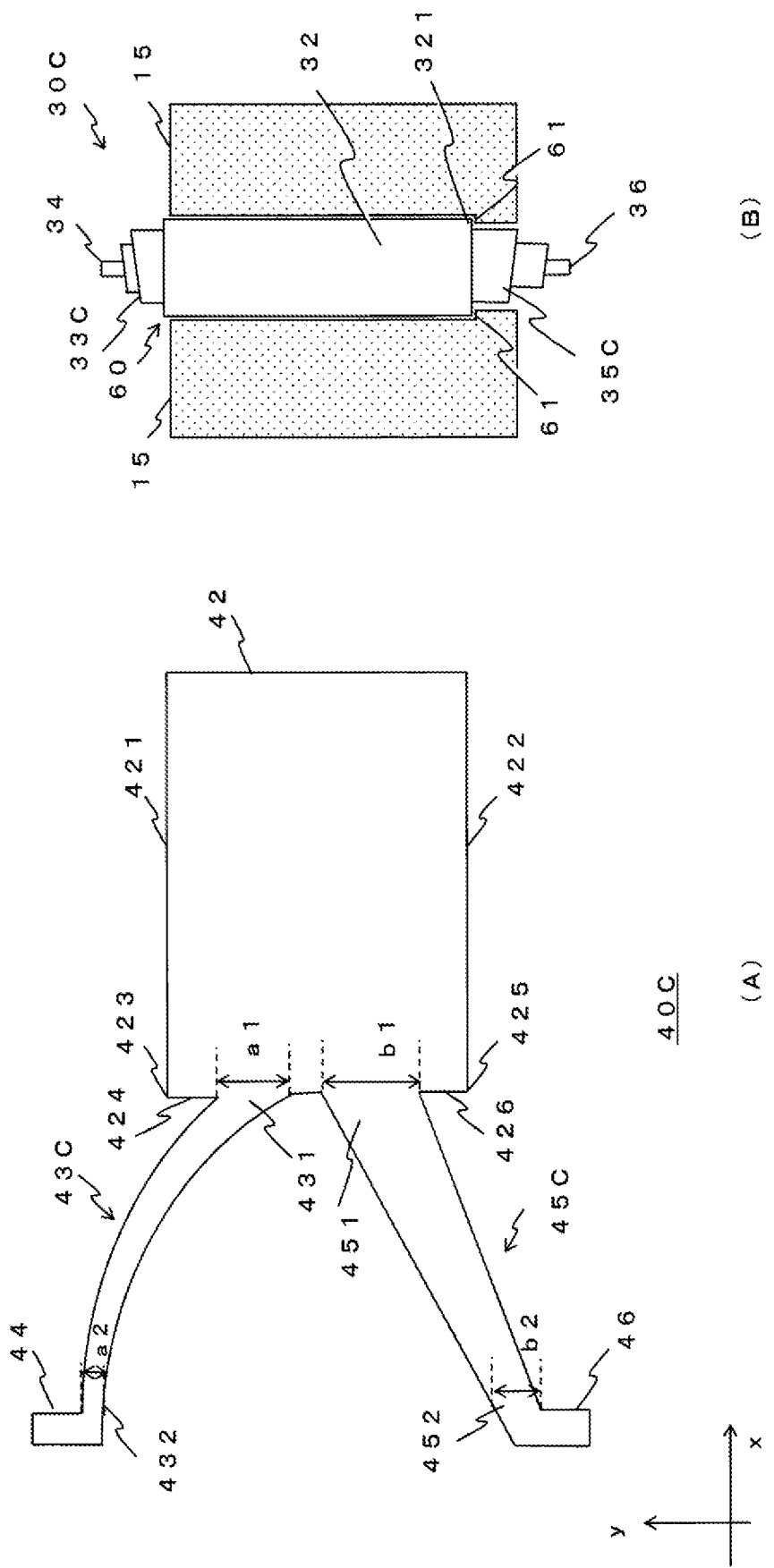
FIG. 9 shows the configuration of an electrical contactor and the configuration of a plate member according to a third embodiment.

FIG. 9 shows the configuration of an electrical contactor and the configuration of a plate member according to the third embodiment.

As illustrated in FIG. 9(A), a plate member 40C according to the third embodiment has the main body part 42, an upper arm part 43C, the first tip part 44 provided at the tip of the upper arm part 43C, a lower arm part 45C, and the second tip part 46 provided at the tip of the lower arm part 45C. As in the case of the first and the second embodiments, the plate member 40C is, for example, a plate member that is formed with noble metal or metal, or is a plate member that is obtained by plating a surface of a plate-like member with noble metal or metal, and is formed by performing punching or the like on the plate-like member. In addition, for example, in the plate member 40C, portions contacting the first contact object and/or the second contact object may be noble metal or the like, and other portions may be formed with a member having excellent elasticity (for example, spring property) such as bimetal.

In FIG. 9(B), an electrical contactor 30C according to the third embodiment has the cylindrical part 32, an upper elastic part 33C, the first contact part 34, a lower elastic part 35C, and the second contact part 36.

The third embodiment describes an embodiment in which the shapes of the upper arm part 43C and the lower arm part 45C of the plate member 40C are deformed in order to adjust load resistance and strokes of the upper elastic part 33C and the lower elastic part 35C acting as spring functions of the electrical contactor 30C.

In FIG. 9(A), the shape of the upper arm part 43C of the plate member 40C is, for example, an arc shape such as a bow shape or a bent shape. That is to say, the shape of the upper arm part 43C is a shape that is curved into a bow shape, or the linear upper arm part 43C is formed in a bent shape. In addition, a width length of the upper arm part 43C in the vertical direction is made relatively small (i.e., the upper arm part 43C is narrow).

In this manner, by forming the upper arm part 43C in a shape that is curved into an arc shape or a bent shape, and narrowing the width length in the vertical direction, the upper elastic part 33C formed by winding the upper arm part 43C can have small energizing force (low load) in the vertical direction. That is to say, a contact load at the time of contact of the first contact part 34 with the first contact object can be made small.

In addition, as in the case of the lower arm part 45 according to the first embodiment, the lower arm part 45C has a shape in which the central axis is linearly extended, while making the width length in the vertical direction thick (a shape in which the lower arm part 45C is made thick). In this manner, by making the lower arm part 45C thick, the lower elastic part 35C formed by winding the lower arm part 45C can have large energizing force (high load) in the vertical direction. That is to say, a contact load at the time of contact of the second contact part 36 with the second contact object can be made large.

The example in FIG. 9(A) and FIG. 9(B) illustrated a case in which the upper arm part 43C has an arc shape or a bent shape, and the lower arm part 45C has a wide shape. However, the lower arm part 45C may have an arc shape or a bent shape, and the upper arm part 43C may have a wide shape or the like in accordance with the contact object of the electrical contactor 30C.

In addition, the width length of the upper arm part 43C and the lower arm part 45C in the vertical direction can be determined in accordance with the material, hardness, and the like of the contact object.

(C-2) Effect of Third Embodiment

As described above, according to the third embodiment, the effect described in the first embodiment can be obtained, and by changing the shapes of the upper arm part and the lower arm part of the plate member forming the electrical contactor, elastic energy and strokes of the upper elastic part and the lower elastic part showing elasticity in the vertical direction can be controlled, thereby allowing adjustment of energizing force of the upper elastic part and the lower elastic part.

(D) Fourth Embodiment

Next, a fourth embodiment of the electrical contactor and the electrical connecting apparatus according to the present disclosure will be described in detail with reference to the drawings.

(D-1) Configuration of Fourth Embodiment

Figure 10:
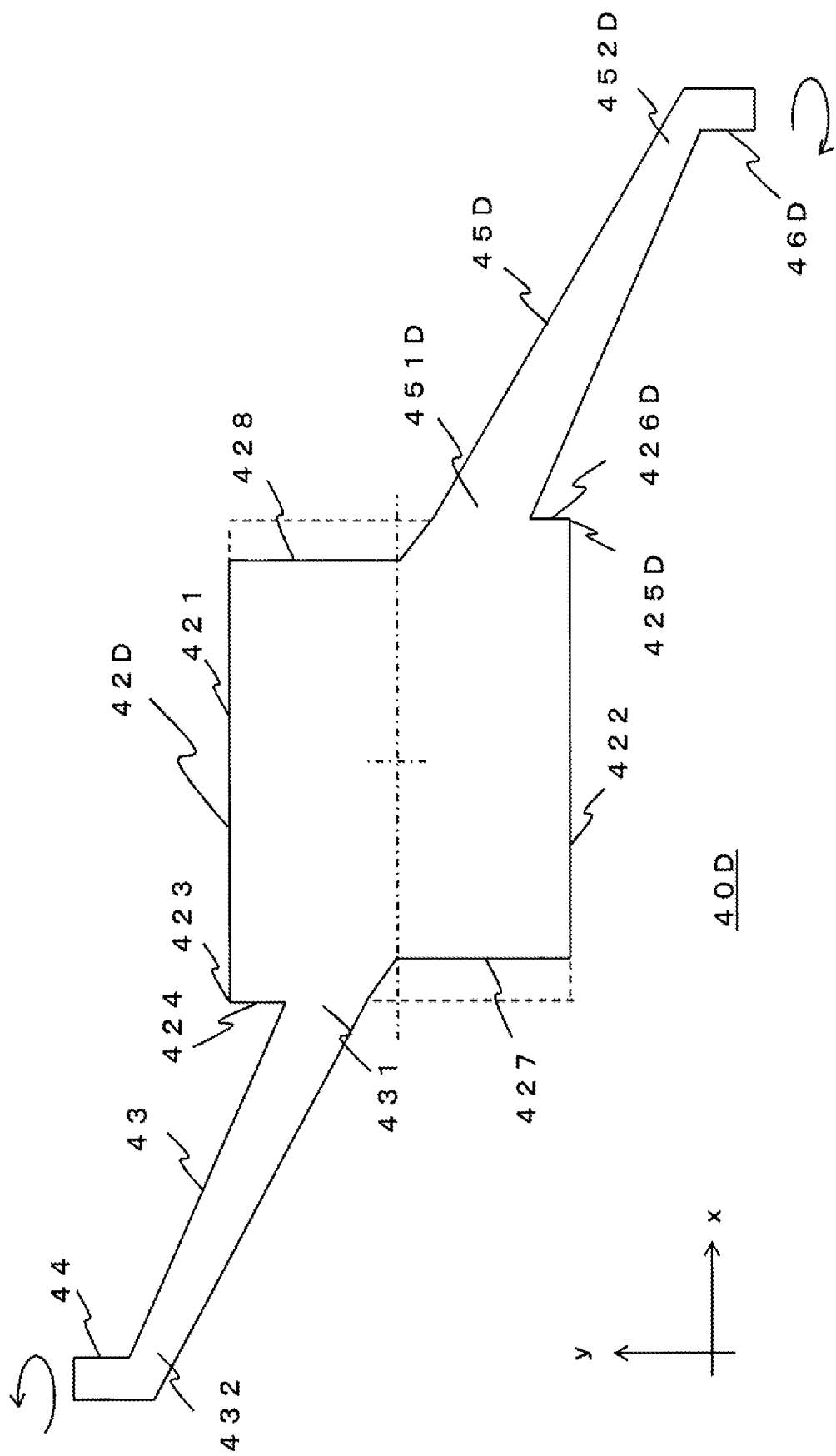
FIG. 10 shows the configuration of a plate member before the formation of an electrical contactor according to a fourth embodiment.
Figure 11:
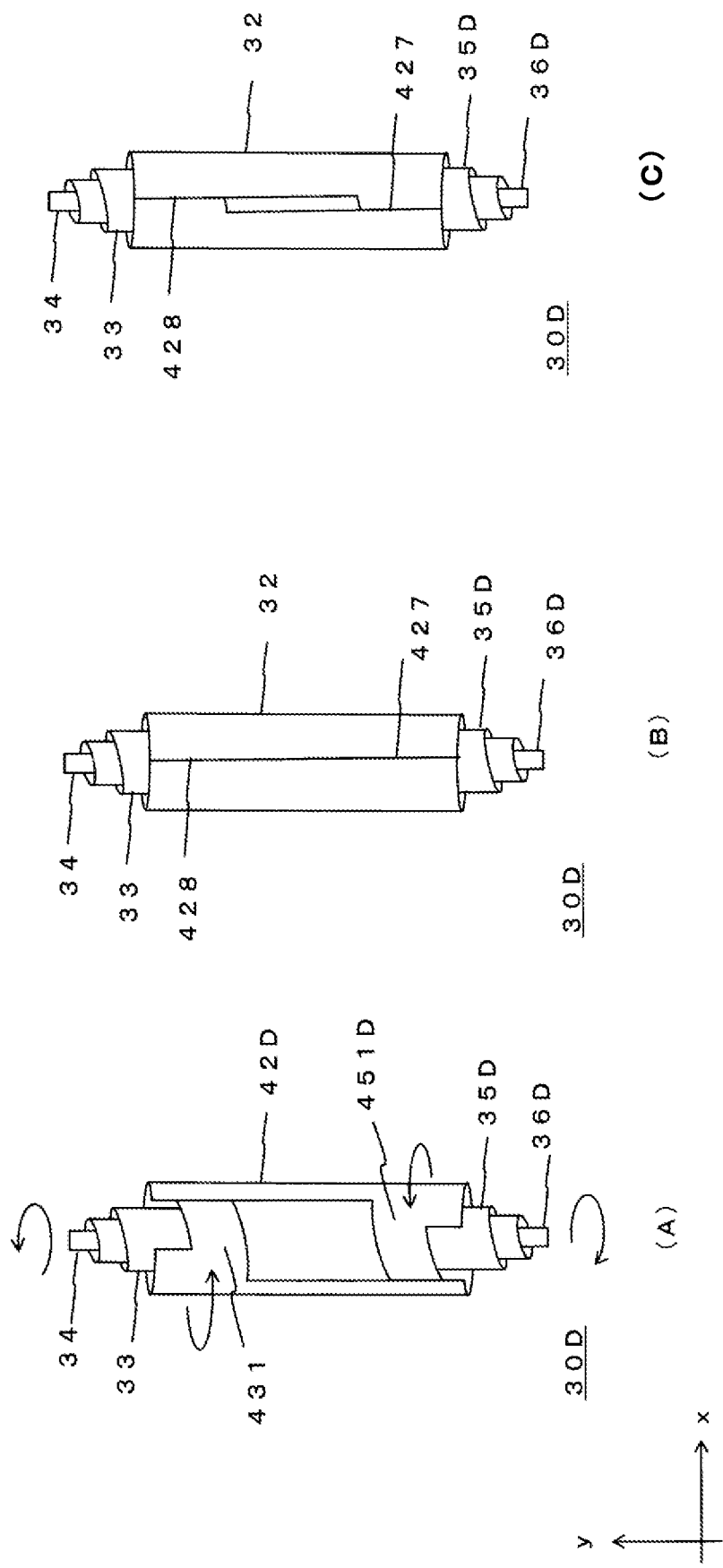
FIG. 11 shows the configuration of the electrical contactor according to the fourth embodiment.

FIG. 10 shows the configuration of the plate member before the formation of the electrical contactor according to the fourth embodiment. FIG. 11 shows the configuration of the electrical contactor according to the fourth embodiment.

As illustrated in FIG. 10, a plate member 40D according to the fourth embodiment includes a main body part 42D, the upper arm part 43 extending to a left oblique upward direction from an upper part in the left side end part of the main body part 42D, the first tip part 44 provided at the tip of the upper arm part 43, a lower arm part 45D extending in a right oblique downward direction from a lower part in the right side end part of the main body part 42D, and a second tip part 46D that is provided at the tip of the lower arm part 45D.

In the plate member 40D according to the fourth embodiment, the upper arm part 43 and the first tip part 44 provided at the tip of the upper arm part 43 are the same as each constituent element described in the first embodiment, and thus the same reference signs are denoted. As in the case of the first to the third embodiments, the plate member 40D is, for example, a plate member that is formed with noble metal or metal, or is a plate member that is obtained by plating a surface of a plate-like member with noble metal or metal, and is formed by performing punching or the like on the plate-like member. In addition, for example, in the plate member 40D, portions contacting the first contact object and/or the second contact object may be noble metal or the like, and other portions may be formed with a member having excellent elasticity (for example, spring property) such as bimetal.

Among the end parts at four sides of the main body part 42D, the lower arm part 45D is integrally coupled with the opposing end part (right side end part) of an end part (left side end part) where the upper arm part 43 is provided, while extending in a right oblique downward direction from the right side end part of the main body part 42D.

As in the case of the first embodiment, the lower arm part 45D has a tapered shape (taper shape) in which the width length in the vertical direction becomes smaller from a base end part 451D on the main body part 42D side to the tip side. In addition, also in the fourth embodiment, as in the case of other embodiments, with respect to the main body part 42D, the base end part 451D of the lower arm part 45D extends from a position that is shifted to a lower position than the base end part 431 of the upper arm part 43, and extends from a position that is slightly above a lower corner part 425D of the right side end part of the main body part 42D. A part of the left side end part of the main body part 42D from the lower corner part 425D to the base end part 451D will be referred to as a "step part 426D" herein.

The second tip part 46D is provided at the tip of the lower arm part 45D, and is a part that is extended vertically downward.

The main body part 42D basically has a substantially rectangle shape as in the cases of other embodiments. However, a lower side end part 427 of the base end part 431 of the upper arm part 43 is positioned closer to the central part of the main body part 42D than the position of the step part 424, which is on the upper side of the base end part 431 of the upper arm part 43. Similarly, in the main body part 42D, an upper side end part 428 of the base end part 451D of the lower arm part 45D is positioned closer to the central part of the main body part 42D than the position of the step part 426D, which is on the lower side of the lower arm part 45D. In this manner, by setting each of the positions of the lower side end part 427 of the upper arm part 43 and the upper side end part 428 of the lower arm part 45D closer to the central part of the main body part 42D, when forming the cylindrical part 32 of an electrical contactor 30D by rounding molding, interference between the wound upper arm part 43 (or lower arm part 45D) and the opposing end part of the main body part 42D (the opposing end part) can be avoided. That is to say, an escape structure is formed by setting each of the positions of the lower side end part 427 of the upper arm part 43 and the upper side end part 428 of the lower arm part 45D closer to the central part of the main body part 42D.

In the fourth embodiment, the winding direction of the upper arm part 43 and the winding direction of the lower arm part 45D are different from each other. For example, the winding direction of the upper arm part 43 is a counter-clockwise direction in the planar view of FIG. 10, and the winding direction of the lower arm part 45D is a clockwise direction in the planar view of FIG. 10.

Firstly, rounding molding is performed on the upper arm part 43 to wind the upper arm part 43 in the counterclockwise direction, and rounding molding is performed on the lower arm part 45D to wind the lower arm part 45D in the clockwise direction.

Next, once the upper elastic part 33 is formed by winding the upper arm part 43, and the lower elastic part 35D is formed by winding the lower arm part 45D, with regard to the main body part 42D, the main body part 42D is uniformly wound from both right and left toward the center of the dash-dot-dash line (central line). In this manner, the electrical contactor 30D illustrated in FIG. 11(A) is formed.

A formation method of the cylindrical part 32 will now be described with reference to FIG. 11(A) and FIG. 11(B). The base end part 431 of the upper elastic part 33 formed by winding the upper arm part 43 is wound so as to be wrapped around with a left side portion of the main body part 42D to which the base end part 431 is coupled. That is to say, the base end part 431 of the upper elastic part 33 is wrapped inside the left side portion of the main body part 42D. Similarly, the base end part 451D of the lower elastic part 35D formed by winding the lower arm part 45D is wound so as to be wrapped around a right side portion of the main body part 42D to which the base end part 451D is coupled.

In this manner, the cylindrical part 32 is formed by wrapping the upper elastic part 33 with the left side portion of the main body part 42D, and at the same time, wrapping the lower elastic part 35D with the right side portion of the main body part 42D, thereby matching (contacting) the left side end part of the main body part 42D with its right side end part. That is to say, the upper elastic part 33 is wrapped around and covered with the back side of the upper side end part 428 in the right side end part of the main body part 42D, and the lower elastic part 35D is wrapped around and covered with the back side of the lower side end part 427 in the left side end part of the main body part 42D. In this manner, the electrical contactor 30D illustrated in FIG. 11(B) is formed. Although FIG. 11(B) illustrates the cylindrical part 32 formed with the main body part 42D having a structure in which the left side end part and the right side end part of the main body part 42D are brought into contact, the structure is not limited thereto. As illustrated in FIG. 11(C), the left side end part and the right side end part of the main body part 42D may be opposed to each other while being slightly separated. In addition, in FIG. 11(A) to FIG. 11(C), when forming the cylindrical part 32 by winding the main body part 42D, fixing may be performed by, for example, welding, an adhesive agent, or the like at any one or a plurality portions of the left side end part and/or the right side end part of the main body part 42D in order to retain the outer shape structure of the cylindrical part 32. For example, in FIG. 11(B), fixing may be performed with, for example, welding, an adhesive agent, or the like at one or a plurality portions where the left side end part and the right side end part of the main body part 42D contact each other. In FIG. 11(C), fixing may be performed with, for example, welding, an adhesive agent, or the like at one or a plurality portions where the left side end part (and/or the right side end part) of the main body part 42D contacts the opposing end part of the cylindrical part 32. The fixing method of the outer shape structure of the cylindrical part 32 is not limited to welding or an adhesive agent, and caulking or the like may be performed.

Since the upper arm part 43 and the lower arm part 45D extend while shifting the positions in the height direction with respect to the main body part 42D, even if the upper elastic part 33 and the lower elastic part 35D are wound so as to be wrapped with the main body part 42D, the upper elastic part 33 and the lower elastic part 35D do not interfere with each other. As a result, the upper elastic part 33 and the lower elastic part 35D of the electrical contactor 30D show elasticity in the axial direction independent from each other.

In this manner, by setting the winding directions of the upper arm part 43 and the lower arm part 45D to different directions from each other, when the first contact part 34 contacts the first contact object and the second contact part 36D contacts the second contact object and a load is applied, stress working on the upper elastic part 33 and stress working on the lower elastic part 35D can be negated.

Accordingly, rotational loads generated at a point of contact when the first contact part 34 contacts the first contact object and a point of contact when the second contact part 36D contacts the second contact object can be reduced.

(D-2) Effect of Fourth Embodiment

As described above, according to the fourth embodiment, the effect described in the first embodiment can be obtained, and by setting the winding directions of the upper arm part and the lower arm part to different directions from each other, stress working on the upper elastic part and stress working on the lower elastic part can be negated, and a rotational load at a point of contact can be reduced.

(E) Fifth Embodiment

Next, a fifth embodiment of the electrical contactor and the electrical connecting apparatus according to the present disclosure will be described in detail with reference to the drawings.

The fifth embodiment illustrates and describes a case in which hollowing out (cutout) is performed on a plate-like portion of the arm part (the upper arm part and the lower arm part) extending from the main body part, in the plate member before molding of the connector (electrical contactor).

The following illustrates a case in which hollowing out is performed on the plate-like portions of both the upper arm part 43 and the lower arm part 45 of the plate member 40 described in the first embodiment. An arm part to be subjected to hollowing out may be any of the upper arm parts (the upper arm parts 43 and 43C) and the lower arm parts (the lower arm parts 45, 45C, and 45D), or all of the upper arm parts (the upper arm parts 43 and 43C) and the lower arm parts (the lower arm parts 45, 45C, and 45D), in the plate members 40, 40A, and 40C described in the first to the fourth embodiments.

(E-1) Configuration of Fifth Embodiment

Figure 13:
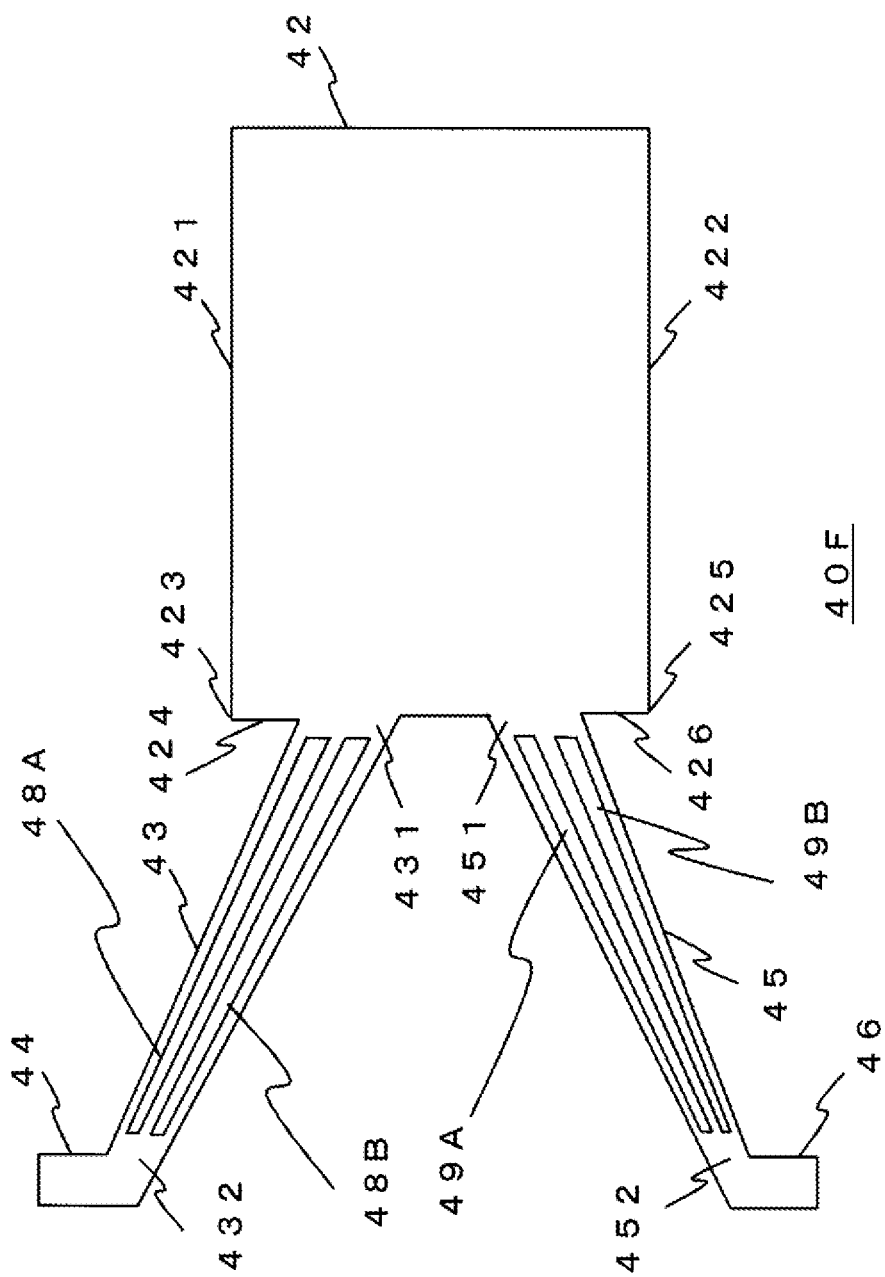
FIG. 13 shows the configuration of the electrical contactor and the configuration of the plate member according to the fifth embodiment (No. 2).
Figure 14:
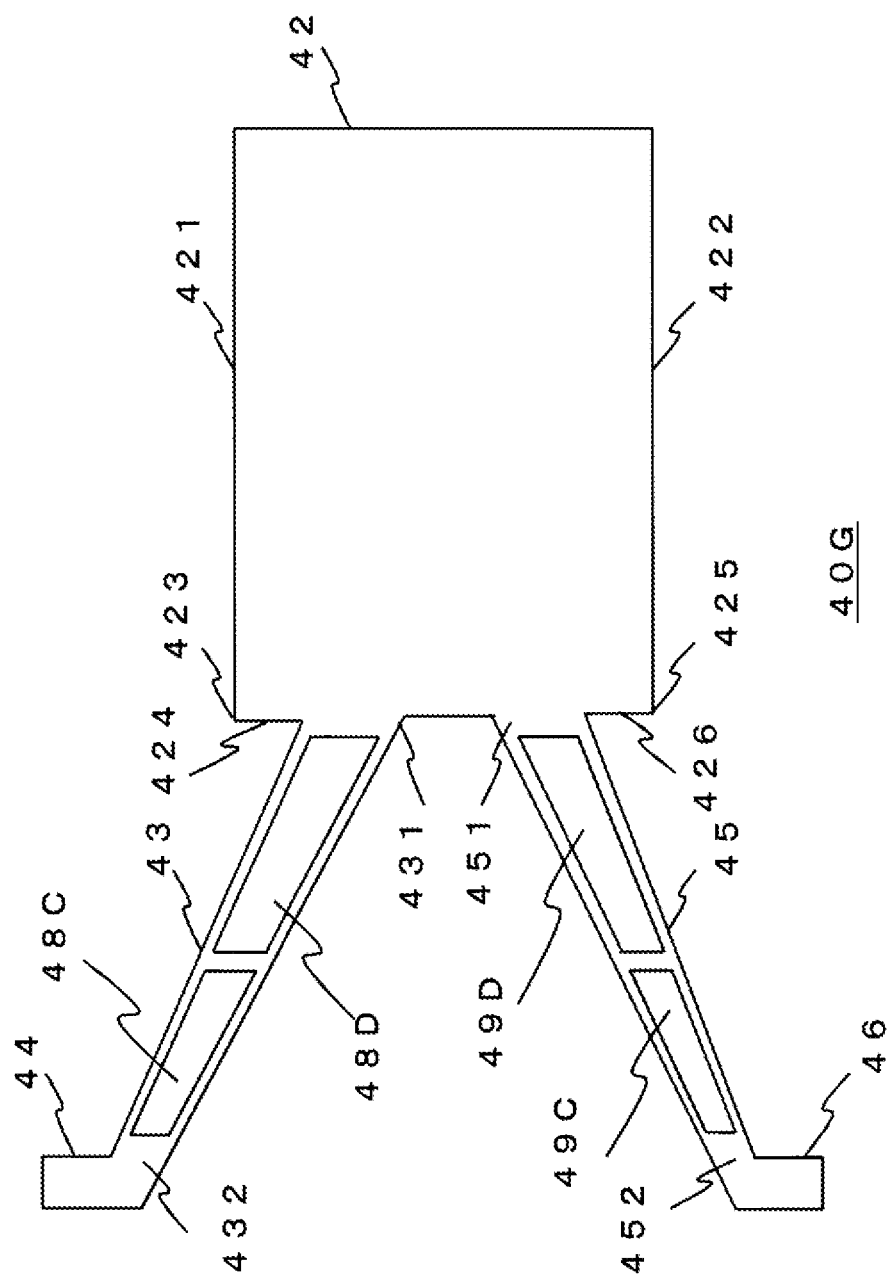
FIG. 14 shows the configuration of the electrical contactor and the configuration of the plate member according to the fifth embodiment (No. 3).
Figure 14:
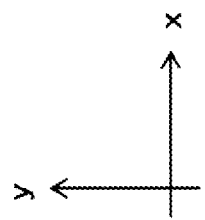

FIG. 12 to FIG. 14 show the configuration of the plate member before the formation of the electrical contactor according to the fifth embodiment.

As illustrated in FIG. 12, in a plate member 40E, hollowing out is performed from the base end part 431 to the tip side of the upper arm part 43 extending from the main body part 42, and a slit part 48 having a substantially trapezoidal shape is formed. Similarly, hollowing out is performed from the base end part 451 to the tip side of the lower arm part 45, and a slit part 49 having a substantially trapezoidal shape is formed.

With the same method as the first to the fourth embodiments, the plate member 40E illustrated in FIG. 12 is wound, and the connector (electrical contactor) 30 is formed. In this manner, since the slit part 48 and the slit part 49 are formed in the upper arm part 43 and the lower arm part 45, the size of loads (contact loads) that the first contact part 34 and the second contact part 36 receive from the first contact object and the second contact object, and strokes of elasticity in the vertical direction shown by the upper elastic part 33 and the lower elastic part 35 can be changed.

That is to say, by forming the slit part 48 and the slit part 49 in the upper arm part 43 and the lower arm part 45, the size of loads on the first contact part 34 and the second contact part 36, and strokes of the upper elastic part 33 and the lower elastic part 35 can be adjusted.

In other words, by adjusting the width length of the slit part 48 (or the slit part 49), the length of the slit part 48 from the base end part 431 to the tip side (or from the base end part 451 to the tip side), the position of the slit part 48 (or the slit part 49), and the like with respect to the width length in the vertical direction of the upper arm part 43 (or the lower arm part 45), the size of the loads on the first contact part 34 and the second contact part 36, and the strokes of the upper elastic part 33 and the lower elastic part 35 can be adjusted (controlled).

Various methods can be widely applied to the adjusting methods of the shapes, the positions, and the like of the slit part 48 and the slit part 49 formed in the upper arm part 43 and the lower arm part 45.

For example, as illustrated in FIG. 13, two slit parts 48A and 48B (or slit parts 49A and 49B) may be arranged in the vertical direction, in the width of the plate-like portion of the upper arm part 43 (or the lower arm part 45). The width length in the vertical direction of each of the two slit parts 48A and 48B (or the slit parts 49A and 49B) may be substantially the same length, or may be different length from each other. Needless to say, three or more of the slit parts 48 (or the slit parts 49) may be arranged.

In addition, for example, as illustrated in FIG. 14, two slit parts 48C and 48D (or slit parts 49C and 49D) may be formed on each of the side closer to the tip side and the side closer to the base end part 431, in the upper arm part 43 (or the lower arm part 45). The lengths of the slit parts 48C and 48D (or the slit parts 49C and 49D) in an extending direction of the upper arm part 43 (or the lower arm part 45) from the base end part 431 toward the tip side may be the same length as each other, or may be different lengths from each other. Needless to say, three or more of the slit parts 48 (or the slit parts 49) may be formed in the extending direction of the upper arm part 43 (or the lower arm part 45).

Furthermore, for example, including FIG. 12 to FIG. 14, the shape of each slit part 48 (or slit part 49) illustrated in this embodiment is not limited to a substantially trapezoid shape, and the shape may be a substantially triangle shape, a substantially rectangle shape, a substantially oval shape, a shape in which both ends are arc shapes, and the like.

(E-2) Effect of Fifth Embodiment

As described above, according to the fifth embodiment, the effects described in the first to the fourth embodiments can be obtained, and by providing one or a plurality of the slit parts in the arm parts (the upper arm part and the lower arm part), the size of the loads on the first contact part and the second contact part of the connector formed by winding the plate member, and the strokes in the vertical direction of the upper elastic part and the lower elastic part, can be adjusted.

(F) Other Embodiment

Although modifications of the present disclosure are referred to in each embodiment described above, the present disclosure is also applicable to the following embodiments.

The electrical contactor described in the second embodiment above illustrates a case in which the upper elastic part formed by winding the upper arm part is provided, and the mountain-like projecting parts are provided at the lower end part of the cylindrical part. However, also in the second embodiment, the shape of the upper arm part may be an arc shape or the like to reduce elastic force of the upper elastic part, and the width length in the vertical direction of the upper arm part may be enlarged to heighten elastic force of the upper elastic part.

Each embodiment described above illustrates a case in which the shapes of the first tip part and the second tip part are rectangle shapes. However, the shapes of the first tip part and the second tip part are not limited thereto. For example, the shapes of the first tip part and the second tip part may be deformed such that the shapes of the first contact part and the second contact part after the winding become a crown shape, a needle shape, and the like. In addition, in order to retain the outer shape structure of the cylindrical part illustrated in each embodiment described above, fixing may be performed with a predetermined method (for example, welding, an adhesive agent, or the like) at any places of the cylindrical part.

REFERENCE SIGNS LIST 30 connector
30A, 30C, and 30D electrical contactor
32 cylindrical part
33 and 33C upper elastic part
34 first contact part
35, 35C, and 35D lower elastic part
36 and 36D second contact part
37 second contact part
40, 40A, 40C, 40D, 40E, 40F, and 40G plate member
42 and 42D main body part
43 and 43C upper arm part
44 first tip part
45, 45C, and 45D lower arm part
46 and 46D second tip part
47 mountain-like projecting part
48, 48A, 48B, 48C, and 48D slit part
49, 49A, 49B, 49C, and 49D slit part
421 upper end part
422 lower end part
423 upper corner part
424 step part
425 and 425D lower corner part
426 and 426D step part
431 base end part
432 tip part
451 and 451D base end part
452 tip part

The invention claimed is:

1. An electrical contactor that is formed with a plate member having conductivity, characterized in that the plate member comprises a main body part, an upper arm part having a tapered shape that extends obliquely upward from one end part of the main body part, a first tip part that is provided at a tip of the upper arm part, a lower arm part having a tapered shape that extends obliquely downward from one end part of the main body part, and a second tip part that is provided at a tip of the lower arm part, the electrical contactor comprising:
- a first contact part that is formed by winding the first tip part, contacting a first contact object;
- a cylindrical part formed by winding the main body part;
- a first elastic part having a volute spring shape, which is formed by winding the upper arm part having the tapered shape,
- wherein an upper end part of the upper arm part is contained with a lower end part of the upper arm part such that a cylindrical outer surface of the upper end part of the upper arm part faces a cylindrical inner surface of a lower end part of the upper arm part, and
- wherein the cylindrical part formed by winding the main body part surrounds a base end part of the lower end part of the upper arm part, leaving exposed the upper end part of the upper arm part;
- a second contact part that is formed by winding the second tip part, contacting a second contact object; and
- a second elastic part having a volute spring shape is formed by winding the lower arm part having the tapered shape,
- wherein a lower end part of the lower arm part is contained within the upper end part of the lower arm part such that a cylindrical outer surface of the lower end part of the lower arm part faces a cylindrical inner surface of the upper end part of the lower arm part, and
- wherein the cylindrical part formed by winding the main body part surrounds a base end part of the lower arm part, leaving exposed the lower end part of the lower arm part.

2. The electrical contactor according to claim 1, wherein the first elastic part and the second elastic part have elasticity in an axial direction.

3. The electrical contactor according to claim 1, wherein
the upper arm part extends from one end part of the main body part, and the first elastic part is formed by winding in a first winding direction, and
the lower arm part extends from an opposing end part that opposes the one end part of the main body part from which the upper arm part extends, and the second elastic part is formed by winding in a second winding direction that is different from the first winding direction.

4. The electrical contactor according to claim 1, wherein the plate member includes a main body part, an upper arm part having a tapered shape that extends obliquely upward from one end part of the main body part, a tip part that is provided at a tip of the upper arm part, and a plurality of mountain-like projecting parts that are provided at a lower end part of the main body part, the electrical contactor comprising:
- a first contact part that is formed by winding the tip part, contacting a first contact object; and
- an elastic part that is formed by winding the upper arm part having the tapered shape, wherein an upper end part of the upper arm part on an outside covers an outer circumference of a lower end part of the upper arm part; and
- wherein the cylindrical part that is formed by winding the main body part contacts a second contact object with the mountain-like projecting parts at the lower end part.

5. The electrical contactor according to claim 1, wherein one of the arm parts extends from an end part of the main body part and is curved in an arc shape.

6. The electrical contactor according to claim 4, wherein one of the arm parts extends from an end part of the main body part and is curved in an arc shape.

7. The electrical contactor according to claim 1, wherein
each of the arm parts extending from an end part of the main body part having a rectangle shape extends from a position that is separated from a corner part of the end part, and
a base end part of each of the elastic parts formed by winding each of the arm parts is covered with an inner surface of the main body part and is contained in the cylindrical part.

8. The electrical contactor according to claim 4, wherein
the main body part has a rectangular shape and one of the arm parts extends from an end part of the main body part from a position that is separated from a corner part of the end part, and
a base end part of each of the elastic parts formed by winding each of the arm parts is covered with an inner surface of the main body part and is contained in the cylindrical part.

9. An electrical connecting apparatus comprising a plurality of electrical contactors to be brought into contact with a first contact object and a second contact object, wherein the electrical contactors are electrical contactors according to claim 1.

10. The electrical contactor according to claim 2, wherein
the upper arm part extends from one end part of the main body part, and the first elastic part is formed by winding in a first winding direction, and
the lower arm part extends from an opposing end part that opposes the one end part of the main body part from which the upper arm part extends, and the second elastic part is formed by winding in a second winding direction that is different from the first winding direction.

11. An electrical connecting apparatus comprising a plurality of electrical contactors to be brought into contact with a first contact object and a second contact object, wherein the electrical contactors are electrical contactors according to claim 2.

12. An electrical connecting apparatus comprising a plurality of electrical contactors to be brought into contact with a first contact object and a second contact object, wherein the electrical contactors are electrical contactors according to claim 3.

13. An electrical connecting apparatus comprising a plurality of electrical contactors to be brought into contact with a first contact object and a second contact object, wherein the electrical contactors are electrical contactors according to claim 4.

14. An electrical connecting apparatus comprising a plurality of electrical contactors to be brought into contact with a first contact object and a second contact object, wherein the electrical contactors are electrical contactors according to claim 5.

15. An electrical connecting apparatus comprising a plurality of electrical contactors to be brought into contact with a first contact object and a second contact object, wherein the electrical contactors are electrical contactors according to claim 6.

16. An electrical connecting apparatus comprising a plurality of electrical contactors to be brought into contact with a first contact object and a second contact object, wherein the electrical contactors are electrical contactors according to claim 7.

17. An electrical connecting apparatus comprising a plurality of electrical contactors to be brought into contact with a first contact object and a second contact object, wherein the electrical contactors are electrical contactors according to claim 8.

\* \* \* \* \*